United States Patent
Matsueda

(10) Patent No.: US 6,525,556 B2
(45) Date of Patent: Feb. 25, 2003

(54) ACTIVE MATRIX SUBSTRATE INSPECTING METHOD, ACTIVE MATRIX SUBSTRATE, LIQUID CRYSTAL DEVICE, AND ELECTRONIC APPARATUS

(75) Inventor: Yojiro Matsueda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/923,445

(22) Filed: Aug. 8, 2001

(65) Prior Publication Data
US 2001/0048318 A1 Dec. 6, 2001

Related U.S. Application Data

(63) Continuation of application No. 09/155,310, filed on Sep. 25, 1998, now Pat. No. 6,281,700.

(30) Foreign Application Priority Data

Jan. 29, 1997 (JP) .............................. 9-29568

(51) Int. Cl.$^7$ .............................. G01R 31/00
(52) U.S. Cl. .............................. 324/770
(58) Field of Search .............................. 324/770, 753, 324/763, 768, 769; 345/3, 50, 87, 98, 100, 204

(56) References Cited

U.S. PATENT DOCUMENTS

| | | | | |
|---|---|---|---|---|
| 5,028,916 A | * | 7/1991 | Ichikawa et al. | 345/204 |
| 5,506,516 A | | 4/1996 | Yamashita et al. | 324/770 |
| 5,532,615 A | | 7/1996 | Kondo et al. | 324/770 |
| 5,576,730 A | | 11/1996 | Shimada et al. | 345/98 |
| 5,748,165 A | * | 5/1998 | Kubota et al. | 345/96 |
| 5,903,234 A | * | 5/1999 | Kimura | 341/144 |
| 6,023,260 A | * | 2/2000 | Higashi | 345/100 |
| 6,222,515 B1 | * | 4/2001 | Yamaguchi et al. | 345/691 |
| 6,281,700 B1 | * | 8/2001 | Matsueda | 324/770 |

FOREIGN PATENT DOCUMENTS

| | | |
|---|---|---|
| JP | 62-131233 | 6/1987 |
| JP | 63-52121 | 3/1988 |
| JP | 64-9375 | 1/1989 |
| JP | 2-154292 | 6/1990 |
| JP | 2-245794 | 10/1990 |
| JP | 5-94159 | 4/1993 |

OTHER PUBLICATIONS

SID 91 Digest, 32.6 Testing TFT–LCD Substrates with a Transfer Admittance Method:, Henry P. Hall et al., pp. 682–685. No date, month, year.
SID 89 Digest, 14.4 Defect–Free Active–Matrix LCD with Redundant Poly–Si TFT Circuit:, Y. Matsueda et al., pp. 238–241. No date, month, year.
SID 96 Digest, 4.2 Low Temperature Poly–Si TFT–LCD with Integrated 6–bit Digital Data Drivers:. Y. Matsueda et al., pp. 21–24. No date, month, year.
SID 98 Digest, 30.1 "A 6–bit–Color VGA Low–Temperature Poly–Si TFT–LCD with Integrated Digital Data Drivers", Y. Matsueda et al.,, pp. 879–882.– No date, month, year.

* cited by examiner

Primary Examiner—Michael Sherry
Assistant Examiner—Minh N. Tang
(74) Attorney, Agent, or Firm—Oliff & Berridge, PLC

(57) ABSTRACT

The invention is a digital driver that enables an output terminal to be in a high-impedance condition for driving data lines, and an inspection circuit that is provided at ends of the data lines opposite to the digital driver. The inspection circuit includes bi-directional switches provided for each of the plurality of respective data lines, and a controller that controls the switching of the switches. By using the inspection circuit provided at the opposite ends of the data lines, inspections of data-line disconnection or digital-driver output can be performed as well as determining whether or not there is a point defect. In addition, since the circuit is designed only for inspection, its size is extremely small, and the circuit can be disposed in a dead space.

15 Claims, 27 Drawing Sheets

ACTIVE MATRIX SUBSTRATE INSPECTING METHOD, ACTIVE MATRIX SUBSTRATE, LIQUID CRYSTAL DEVICE, AND ELECTRONIC APPARATUS

This is a Continuation of U.S. application Ser. No. 09/155,310 now U.S. Pat No. 6,281,700 filed Sep. 25, 1998, the entire disclosure of which is incorporated herein by reference.

BACKGROUND OF THE INVENTION

1. Field of Invention

The invention relates to an active matrix substrate inspecting method, an active matrix substrate, a liquid crystal device and an electronic apparatus. In particular, the invention relates to techniques for inspecting a type of active matrix substrate in which a digital data-line driver, i.e., a driver in which a digital signal is input and converted from digital to analog form to output an analog signal for driving data lines, (hereinafter referred to as a "digital driver") is formed on the substrate.

2. Description of Related Art

In recent years, research has been conducted on an active matrix substrate with a built-in driver in which driving circuits (drivers) for scanning lines and data lines are formed on a substrate, and a liquid-crystal display device using the substrate. Such an active matrix substrate is produced using low-temperature polysilicon techniques, for example. In order to sell the products, which use the above active matrix substrate, on the market, it is necessary to accurately perform a testing of good or bad products from the perspective of guaranteeing reliability prior to the panel assembly after the substrate is formed.

According to a study conducted by the present inventor, the above-described inspection mainly requires basic inspections, such as checking the drivers' output ability and detecting a disconnection of the data lines, and inspections of the characteristics of switching devices (TFTs, MIMs, etc.) included in pixels as well as the leak characteristics of storage capacitors, which relate to an inspection on a point defect in an active matrix unit.

In the case of a digital driver for driving the data lines (namely, digital-data-line driver), a method for performing simultaneous driving at predetermined timing (line-at-a-time driving method) has been employed by paying attention to the ease of digital data storing.

A display device with such built-in digital-line-at-a-time-driving driver has not been realized, so that the manner in which the above-described highly reliable inspections are performed is not clear.

Therefore, one of the objects of the invention is to establish a testing technology of the active matrix substrate in which a digital driver is loaded and to sell substrates, display devices, or the like with high reliability on the market.

SUMMARY OF THE INVENTION

In order to accomplish this object, the invention has the following structures.

The invention includes:
a plurality of scanning lines and a plurality of data lines;
a digital driver that enables an output terminal to be in a high-impedance condition, the digital driver being provided for driving the plurality of data lines;
switching devices connected to each scanning line and each data line;
capacitors connected to the each of switching devices; and
an inspection circuit provided at ends of the data lines opposite to the digital driver, the inspection circuit including bi-directional switches provided for each of the plurality of data lines, and control means for controlling the switching of the switches.

Because the digital driver for the data lines has a D/A converter in an output unit, an active matrix unit testing (measurement of point defects) cannot be performed by reading the signal again which was once output through the common channel.

However, according to the invention, since the inspection circuit is provided at the opposite ends of the data lines to the digital driver, signals can be written in the capacitors (storage capacitors) in the active matrix unit by driving the data lines with the digital driver, and the written signals can be read out through the inspection circuit. Accordingly, determination of whether or not there is a point defect can be made.

In the case of the signal reading with the inspection circuit, when the output of the digital driver (A/D conversion output) is turned on, defect determination based on signals read out from the storage capacitors is not secured. Thus, in order to acquire a basic signal for point-defect determination, the output of the inspection circuit needs to be switched off (set to be in a high-impedance condition). Therefore, the digital driver includes the function of enabling the output to be in a high-impedance condition.

In addition, since the inspection circuit is provided as a circuit used for inspection, it does need to operate at high speed like the digital driver, and it only needs a minimum function, for example, being capable of performing inspection. Accordingly, in accordance with the invention, the digital driver has a structure including bi-directional switches, e.g., analog switches, and control means for controlling the switching of the switches. The digital driver's simplified circuit arrangement and the fact that it is not required to have advanced operating characteristics enables it to be a small transistor size, which provides the advantage of space reduction. Therefore, the inspection circuit can be mounted on the active matrix substrate easily.

The "inspection circuit" means a circuit that is mainly used for inspection and not having the function of driving the data lines like the digital driver. However, the "inspection circuit" can have another object which is different from inspection, and it can include a component that can be used to accomplish an object other than inspection.

Devices included in the inspection circuit are produced, together with devices included in the digital driver, by an identical production process.

On one active matrix substrate, a digital driver and an inspection circuit are produced by an identical process. For example, using low-temperature polysilicon-thin-film-transistor (TFT) techniques enables their production.

The digital driver includes a switch in its output unit, and opening the switch causes the output unit to be in a high-impedance condition.

The switch is provided in the output unit in order to make the output of the digital driver be in a high-impedance condition.

The digital driver includes any one of a switched capacitor D/A converter, a resistor ladder D/A converter and a PWM D/A converter.

Examples of a D/A converter that is mountable on an active matrix substrate in accordance with the invention are described below.

In a switched capacitor D/A converter, for example, switches are provided for each of the weighted capacitors, and the charge of each capacitor is combined with a coupling capacitor by control of the switching of the switches so as to generate a conversion voltage.

In a resistor ladder D/A converter, for example, a resistance-divided voltage is selectively extracted by control of the switching of the switches provided at the output channels so as to generate a conversion voltage.

In a PWM D/A converter, for example, the on-duration of a switch connected to a voltage source in which a voltage value varies with time (ramp-wave) is controlled in accordance with a digital data value so as to generate a conversion voltage.

The control means in the inspection circuit performs point-at-a-time scanning of the bi-directional switches.

The inspection circuit has, for example, a point-at-a-time scanning system of data lines using shift registers, etc. and performs inspection by the point-at-a-time reading of data.

When the number of the bi-directional switches is M, where M is a natural number not less than 2, the control means in the inspection circuit repeatedly performs the simultaneous driving of P, where P is a natural number, bi-directional switches Q, where Q is a natural number, times, whereby the driving M (M=P×Q) of bi-directional switches in total is realized.

The inspection circuit uses a method different from point-at-a-time scanning.

At least a part of the inspection circuit is disposed in a space, which is in the active matrix substrate and not contributing to the realization of substantial functions, such as displaying an image.

Since the inspection circuit only needs to be a small transistor size and thus only occupies a small area, at least a part of the inspection circuit can be disposed in a space, which is in the active matrix substrate and not contributing to the realization of substantial functions, such as displaying an image, namely, a so-called dead space. Therefore, the enlargement of the active matrix substrate and liquid-crystal display device can be suppressed.

The inspection circuit is disposed in a sealing position formed by sealing material in a panel production process.

The position to be sealed by the sealing material in a panel production process is a dead space inevitably generated in the active matrix substrate. By disposing the inspection circuit in this space, the effective use of space can be achieved.

Each of the inspection circuit and the digital driver is divided into multiple pieces and disposed on the active matrix substrate.

There are cases when a further effective use of the dead space is possible by disposing circuits separately. Furthermore, a layout design with extra spaces is possible when the number of devices in one block decreases only for the separated part. Moreover, it is also possible to decrease the number of the operation frequency of the circuits which operate in series a shift register or the like only for the amount in which the number of devices decreased.

The inspection circuit is separated into at least a first inspection circuit and a second inspection circuit, while the digital driver is separated into at least a first digital driver and a second digital driver.

The first digital driver and the first inspection circuit are disposed so as to be opposed, with the data lines provided therebetween. The second digital driver and the second inspection circuit are disposed so as to be opposed, with the data lines provided therebetween.

The first digital driver and the second inspection circuit are disposed at identical ends of the data lines, and the second digital driver and the first inspection circuit are disposed at identical ends of the data lines.

A layout is formed in which the separated identical-type circuits, each of the first circuit and the second circuit, are disposed at the opposite sides of the data lines provided between them.

Since the circuits are dispersed and disposed on the top and bottom surfaces of the active matrix substrate, dead space around the display region is easy to effectively use. In particular, there are dead spaces, uniformly at sealing positions around, at the top and bottom of, the substrate, which is advantageous when the spaces are effectively used.

In addition, the circuit separation reduces the number of devices in one circuit block in accordance with the number of separations, which provides enough space for the layout. It is possible to decrease the number of operation frequency of the circuits which operate in series a shift register or the like only for the amount in which the number of devices decreased.

There is provided a method for inspecting an active matrix substrate, the method comprising the steps of:
  writing signals in the capacitors connected to the switches by using the digital driver to drive the data lines;
  causing the output of the digital driver to be in high-impedance condition; and
  acquiring a basic signal to be a basis of inspection by reading the signals written in the capacitors by the inspection circuit, and inspecting an active matrix unit, based on the acquired signal.

Next, a basic method for inspecting an active matrix unit using an active matrix substrate is described as follows.

The inspection of the digital driver itself and the inspection for the data line disconnection are performed before each step is executed.

Before the active matrix unit is inspected, the output characteristics of a digital driver itself and the disconnection of data lines are inspected (preliminary inspection).

In the active matrix substrate of the invention which was described above, the inspection circuit is disposed so as to oppose a digital driver, with data lines provided between them. Thus, if each data line is line-at-a-time driven, for example, just once by a digital driver, the inspection circuit is scanned by a line or point sequence as it is synchronized with the scanning, and the signal which is transmitted through data line is received, it is possible to easily perform a preliminary inspection by the receptor or the amplitude of the received signals or the like.

The step of inspecting the active matrix unit, based on the acquired basic signals, includes the step of considering the two-dimensional distribution of the basic signal characteristics in the active matrix unit.

In many cases, the basic signal to be acquired for inspecting the active matrix unit includes considerable noise. Accordingly, it is effective to perform relative inspection with consideration on not only the absolute value of the signal characteristic but abnormality in the signal characteristic distribution, e.g., the existence of a particular portion indicating abnormality in the form of a significant point, compared with the neighborhood, and so on.

The step of inspecting the active matrix unit, based on the acquired basic signal, includes the step of comparing the acquired basic signal with a sample signal, which is previously prepared.

This is a method of inspecting by using the comparison of the sample signals. Furthermore, the liquid crystal device is

BRIEF DESCRIPTION OF THE DRAWINGS

FIG. 19 is a chart showing a layout of a scanning-line driving circuit, a data-line scanning circuit, an inspection circuit, and so on.

DETAILED DESCRIPTION OF THE PREFERRED EMBODIMENTS

Figure 1:
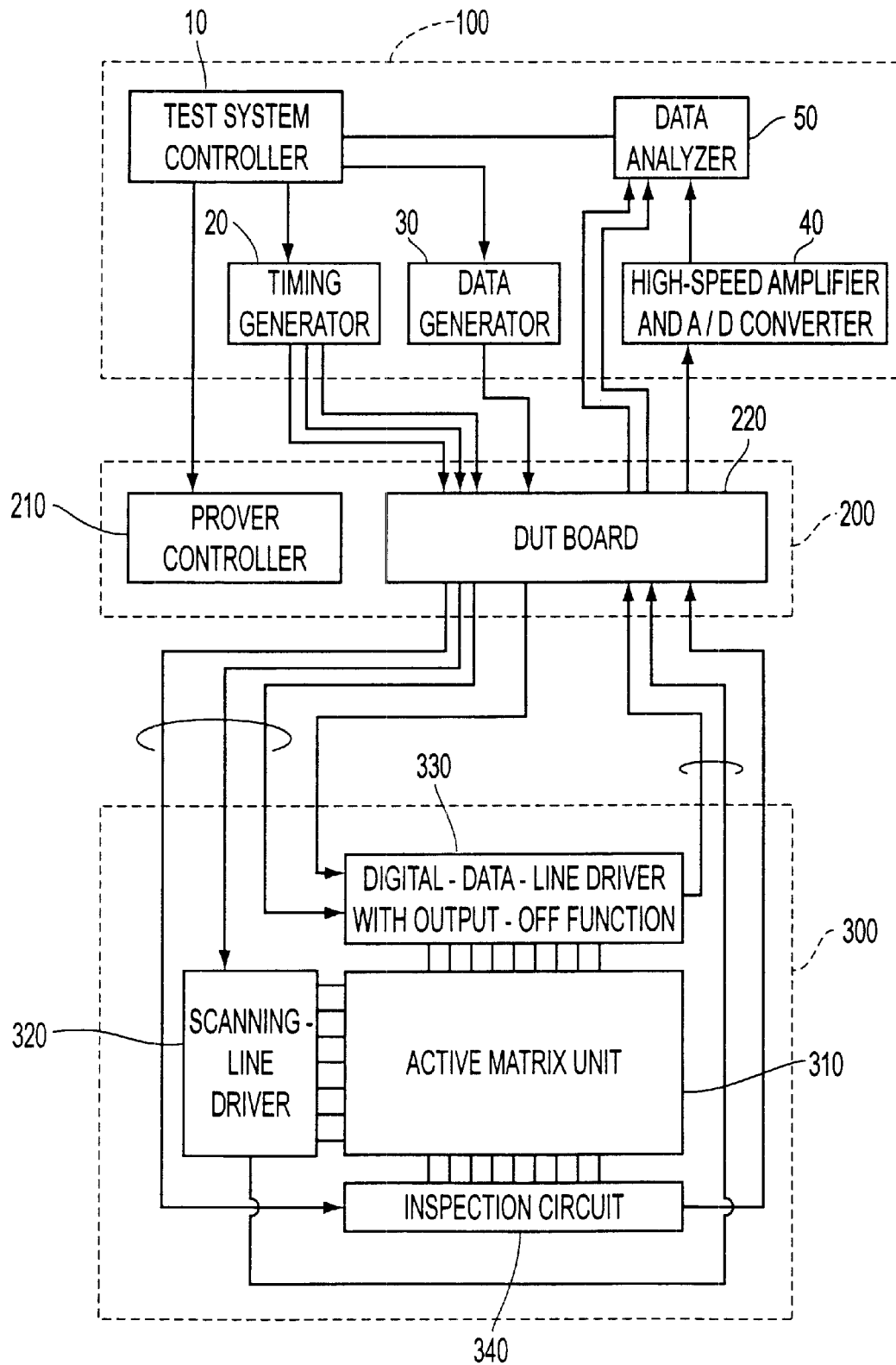
FIG. 1 is a block diagram showing an apparatus for executing one example of an active-matrix-substrate inspecting method of the invention.

A more detailed description will be given with reference to the following embodiments of the invention which are shown in the drawings.

First Embodiment (1) Outline of an Inspection System and its Operation

FIG. 1 is a block diagram showing the entire apparatus for executing one example of an active-matrix-substrate inspecting method of the invention.

This embodiment describes a case where an active matrix substrate (hereinafter referred to as a "TFT substrate") having switching devices, in a pixel portion, that is formed of thin film transistors (TFTs), is inspected.

In FIG. 1, a TFT substrate tester 100 includes a test system controller 10 for monitoring and controlling an inspection operation, a timing generator 20 for generating various timing signals, a data generator 30 for outputting data for inspection, a high-speed amplifier and A/D converter 40, and a data analyzer 50 to which data output from the A/D converter is input and which performs predetermined analysis.

A full-autoprover 200 includes a prover controller 210 and a DUT board 220 as an interface of various signals.

A TFT substrate 300 has an active matrix unit, a scanning line driver 320, a digital-data-line driver 330 with an output-off function (hereinafter simply referred to as a "digital-data-line driver"), and an inspection circuit 340. The output-off function is the function of enabling output to forcibly be in a high impedance condition. In inspection, a probe, i.e., an inspection, terminal not shown in FIG. 1, of the full-autoprover is connected to a predetermined terminal, not shown in FIG. 1, in which the TFT substrate 300 is exposed.

In addition, under the monitoring and control of the test system controller 10, timing signals and inspection data are output from the timing generator 20 and the data generator 30 in the TFT substrate tester 100. These are sent to the TFT substrate 300 via the DUT board 220 in the full-autoprover 200.

The timing signals are input to the scanning-line driver 320 in the TFT substrate 300, the digital-data-line driver 330, and the inspection circuit 340, respectively, and the inspection data are input to the digital-data-line driver 330.

After a predetermined inspection process ends (details of the inspection operation will be described below), the inspection circuit 340 outputs an acquired analog signal (hereinafter referred to as a "basic signal"), which is a basis for inspection, and this basic signal is sent to the TFT tester 100 via the DUT board 220 in the full-autoprover 200. It is amplified and converted from analog to digital form by the high-speed amplifier and A/D converter in the TFT test system controller 10, and the converted data are input to the data analyzer 50, in which the predetermined analysis of them is performed.

(2) Outline of Circuits Formed on the TFT Substrate 300

Figure 2:
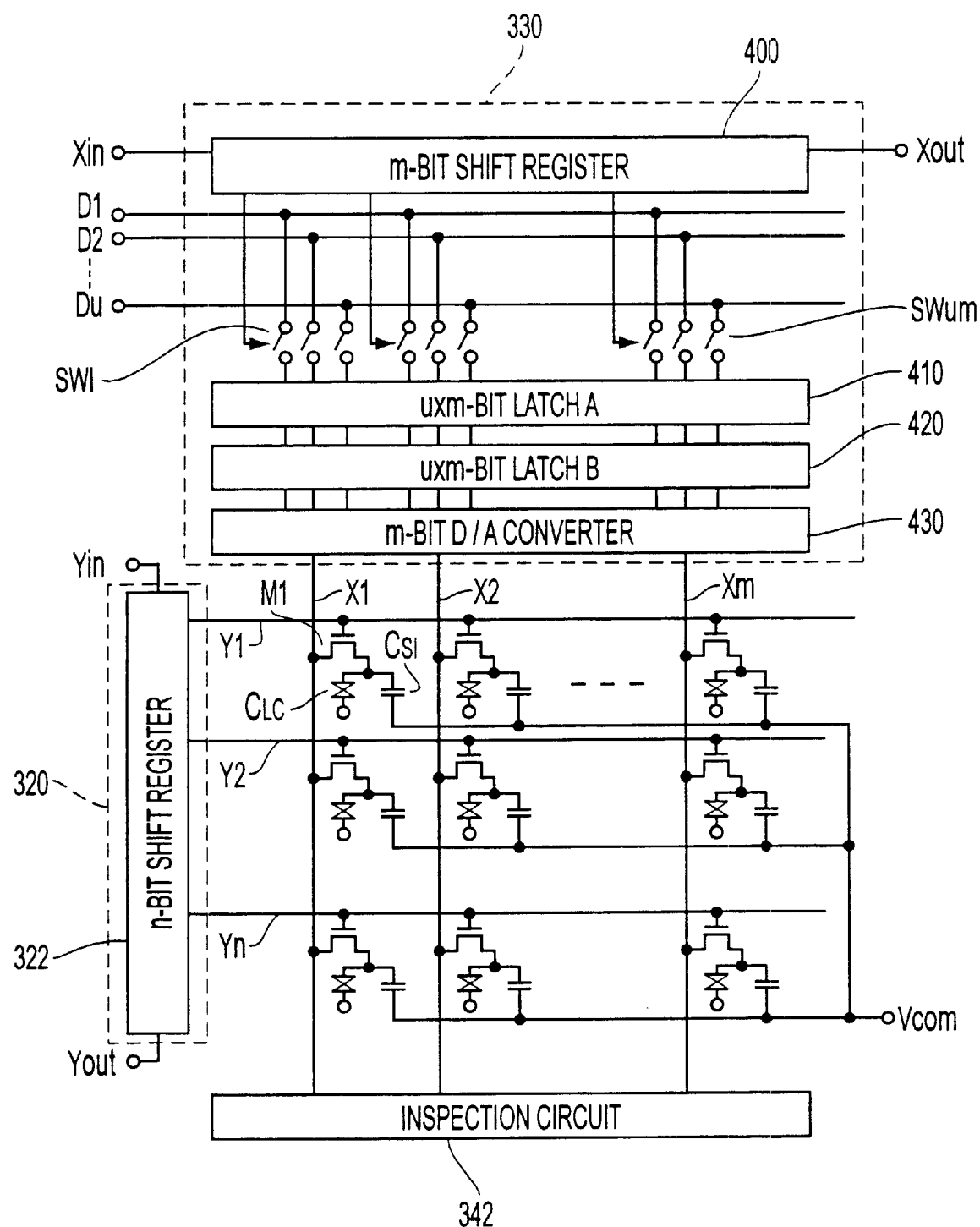
FIG. 2 is a block diagram showing an example of circuits mounted on an active matrix substrate of the invention.

FIG. 2 shows an example of a specific block diagram of the TFT substrate 300 of FIG. 1. In order to enable an inspection to be performed using the inspection system shown in FIG. 1, the TFT substrate 300 needs to fulfill several necessary conditions.

In other words, the necessary conditions are that the digital-data-line driver has an output-off function, i.e., the function of enabling output to be in a high impedance condition, and that each pixel portion has a capacitance in substrate condition.

As shown in FIG. 2, the digital-data-line driver 330, built into the TFT substrate 300, includes an m-bit shift register 400, a u-bit-data input terminal (D1 to Du, u×m switches SW1 to SWum, a u×m-bit latch A (reference numeral 410) and a latch B (reference numeral 420)), and an m-bit D/A converter 430. In this embodiment, the D/A converter 430 has an output-off function.

The scanning-line driver 320 includes an n-bit shift register 322.

The active matrix unit includes a plurality of data lines X1 to Xm, a plurality of scanning lines Y1 to Yn, TFTs (M1), which are arranged in a matrix and are connected to the scanning lines and the data lines, and storage capacitors (holding capacitors) $C_{s1}$. The existence of the storage capacitors $C_{s1}$ enables point defects in substrate condition to be measured.

In TFT substrate condition, no liquid crystal capacitors $C_{LC}$ exist. However, in FIG. 2, to facilitate ease of understanding, the liquid crystal capacitors $C_{LC}$ are shown for convenience. In addition, terminals of the storage capacitors $C_{s1}$, opposite to their terminals to the TFTs (M1), are held to have a common potential $V_{COM}$.

(3) Specific Structures

① Structure of Storage Capacitor

Figure 9A:
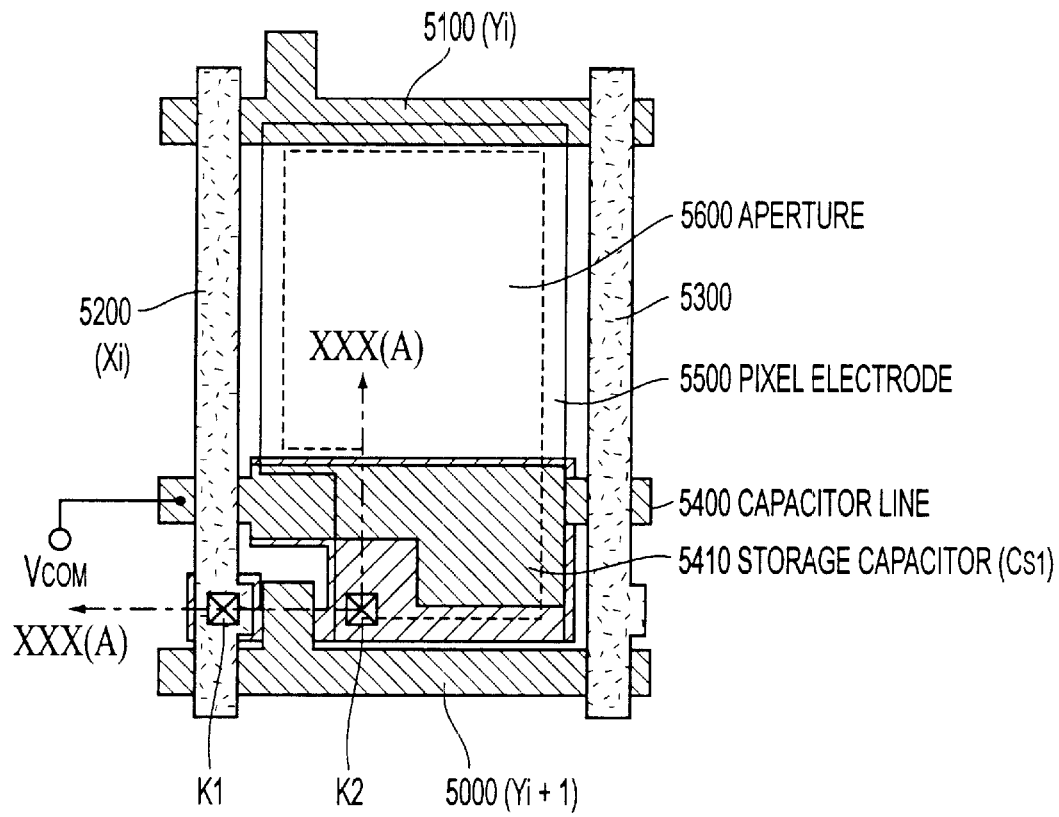
FIG. 9(a) is a plan view showing one example of the structure of one pixel included in an active matrix unit.
Figure 9B:
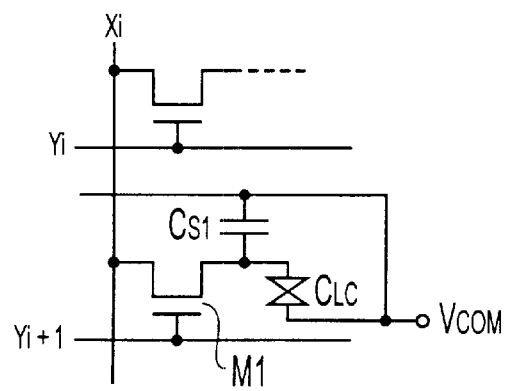
FIG. 9(b) is an equivalent circuit diagram of the structure in FIG. 9(a).

In FIGS. 9(a) and FIG. 9(b), the structure of one pixel in the active matrix unit of FIG. 2 is shown.

FIG. 9(a) shows its layout, and FIG. 9(b) shows its equivalent circuit. The sectional structure of the device taken along plane A—A in FIG. 9(a) is shown in FIG. 30(a).

In FIG. 9(a), reference numerals 5000, 5100 denote scanning lines, and reference numerals 5200, 5300 denote data lines. In addition, reference numeral 5400 denotes a capacitor line, and reference numeral 5500 denotes a pixel electrode.

Figure 30A:
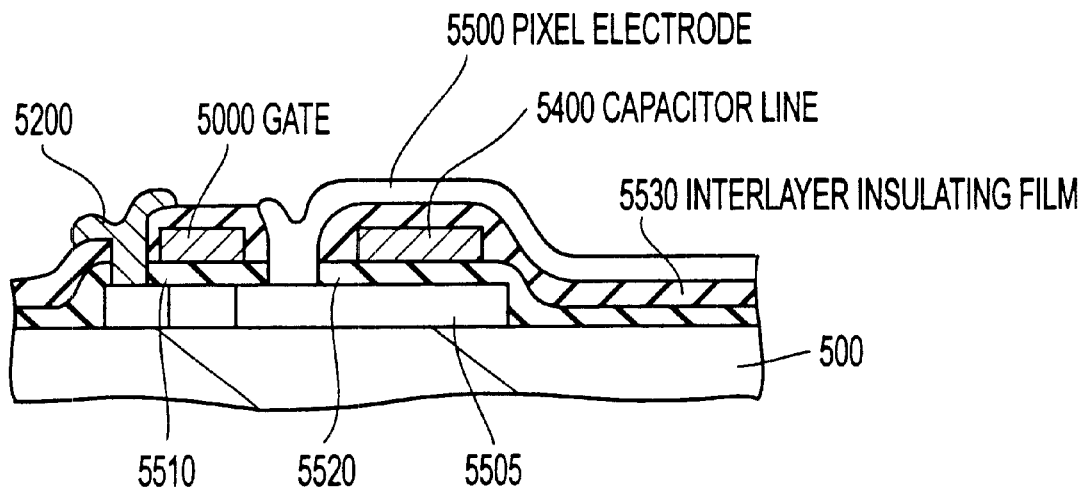
FIG. 30(a) is a sectional structural view of the device taken along plane A—A shown in FIG. 9(a)

As is clear from FIG. 30(a), an insulating film 5520 similar to an insulating film 5510 is formed between an extension 5505 of the drain of a TFT and a capacitor line 5400 that is simultaneously formed using a step for forming a scanning line (gate electrode) 5000, and an interlayer insulating film 5530 is formed between the capacitor line 5400 and the pixel electrode 5500. These elements constitute a storage capacitor ($C_{s1}$) 5410. Reference numeral 5600 denotes an aperture (region through which light is transmitted), and K1, K2 denote contact regions.

Figure 10A:
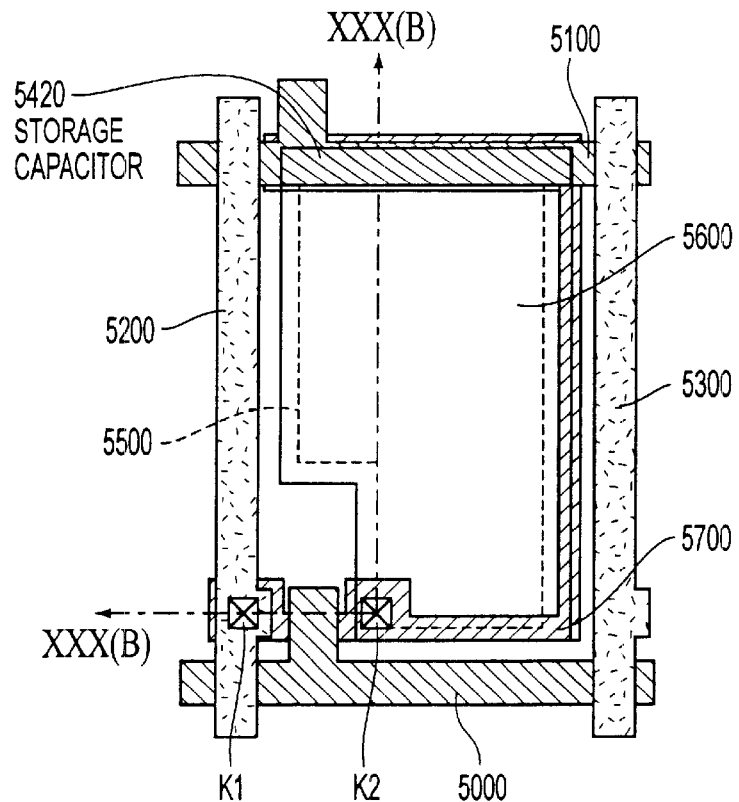
FIG. 10(a) is a plan view showing another example of the structure of one pixel included in the active matrix unit.
Figure 10B:
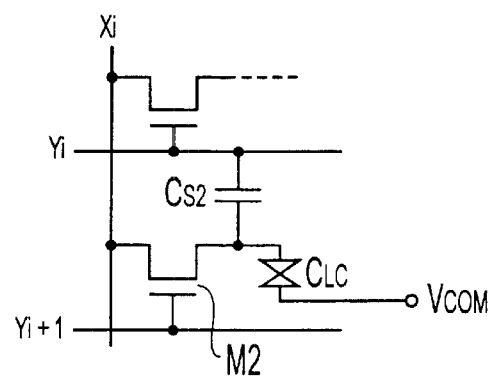
FIG. 10(b) is an equivalent circuit diagram of the structure in FIG. 10(a).
Figure 30B:
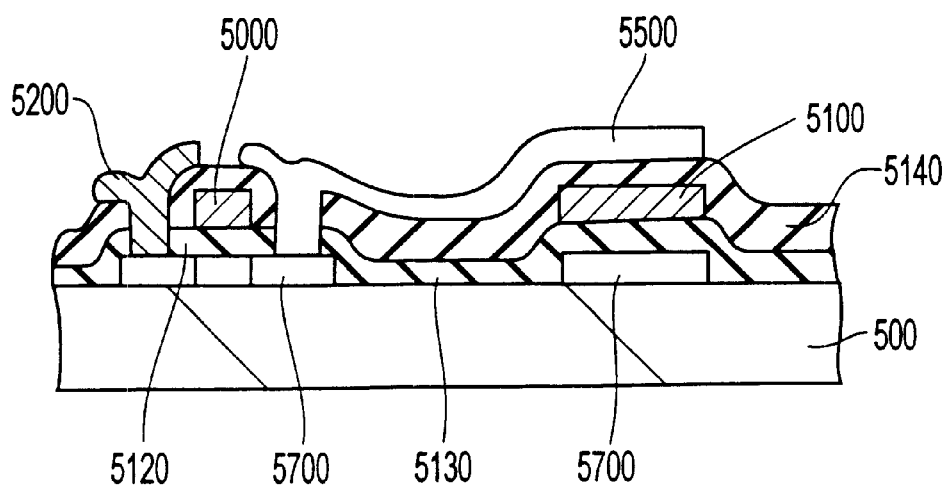
FIG. 30(b) is a sectional structural view of the device taken along plane A—A shown in FIG. 10(a).

The storage capacitor ($C_{s1}$) can be formed using the structure as shown in FIGS. 10, (a) and FIG. 10(b). FIG. 30(b) shows the sectional structure of the device taken along plane A—A in FIG. 10(a).

In FIG. 9(a) and FIG. 9(b), the capacitor lines are separately formed. However, in FIG. 10(a) and FIG. 10(b), the storage capacitor is formed by causing the extension of the TFT drain to overlap with an adjacent scanning line (gate electrode).

In other words, as shown in FIG. 10(a) and FIG. 30(b), an insulating film 5130 similar to a gate insulating film 5120 is formed between a drain extension 5700, that is formed of polysilicon, and an adjacent scanning line (gate electrode) 5100, and an interlayer insulating film 5140 is formed between the adjacent scanning line 5100 and the pixel electrode 5500. These elements constitute a storage capacitor 5420. In FIG. 10(a), portions corresponding to those shown in FIG. 9(a) are denoted by identical reference numerals.

② Structure of D/A Converter

Those elements having structures shown in FIG. 11 to FIG. 14 can be utilized with the m-bit D/A converter 430 of FIG. 2.

When a point defect inspection is performed, it is required that the output of a D/A converter is switched off after a signal is written in the capacitor of a pixel. Accordingly, any of the D/A converters shown in FIG. 11 to FIG. 14 has an output-off functions, i.e., the function of causing the output to be in a high impedance condition. A specific description will be given below.

Switched Capacitor D/A Converter

Figure 11:
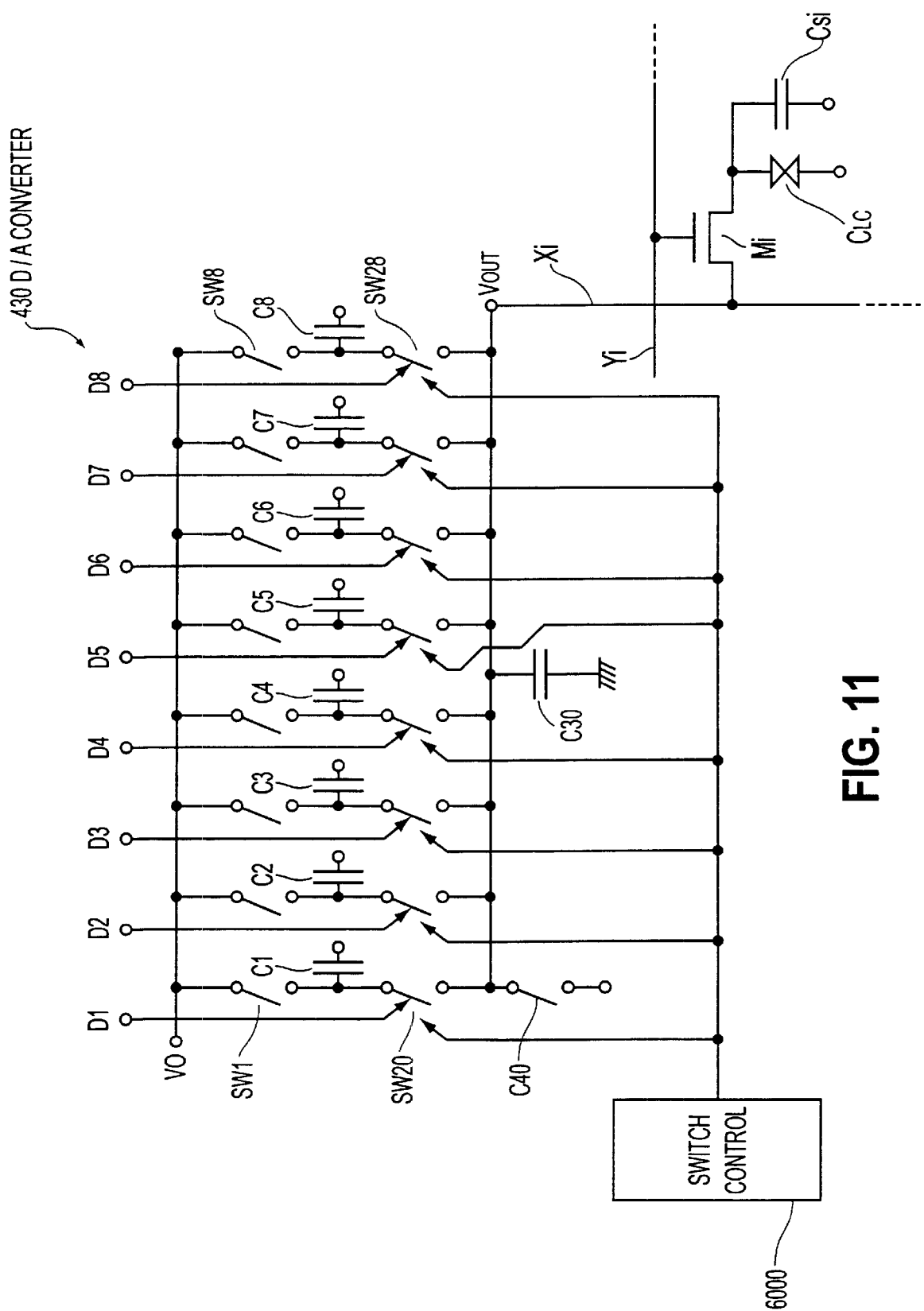
FIG. 11 is a chart illustrating an outline of a structural example of a capacitance-divisional D/A converter usable in the invention.

The D/A converter 430 shown in FIG. 11 is a switched capacitor D/A converter with an output-off function. In this converter, electric charge is accumulated in weighted capacitors, i.e., binary weight capacitors, C1 to C8, and when 8-bit input data D1 to D8 are "1", the corresponding switches (SW20 to SW28) are closed to transfer the electric charge between the respective capacitors (C1 to C8) and a coupling capacitor C30, whereby a conversion voltage corresponding to the 8-bit input data D1 to D8 is generated at an output terminal $V_{OUT}$. In FIG. 11, the switches (SW1 to SW8) are reset switches for the capacitors C1 to C8, and V0 is a reset voltage. A switch C40 is a reset switch for the coupling capacitor C30.

A switch control circuit 6000 is provided in order to forcibly open the switches SW20 to SW28 so that the output terminal $V_{OUT}$ is in a floating condition, i.e., high impedance condition.

Figure 12:
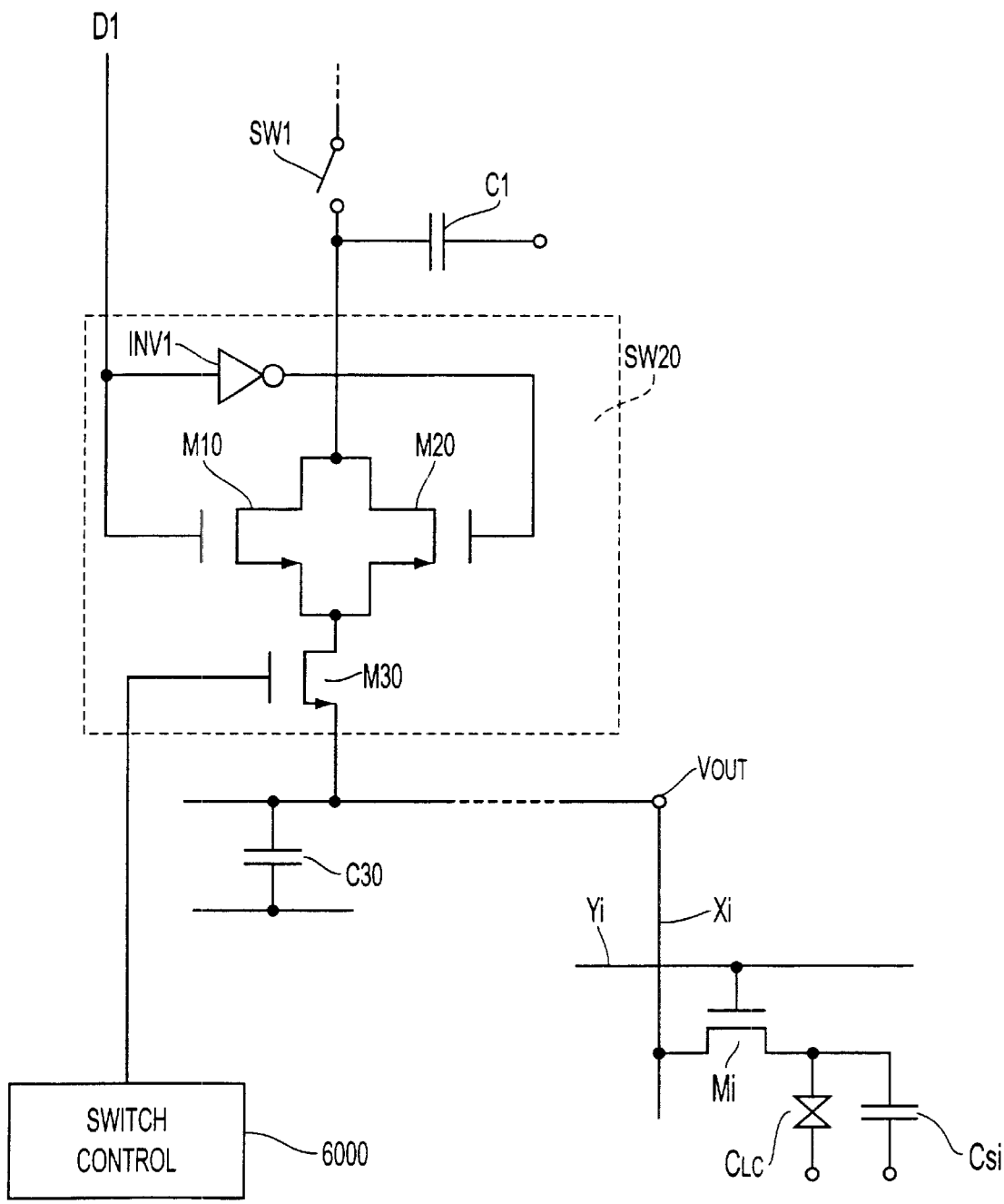
FIG. 12 is a diagram showing an structural example of the circuit of a part of the capacitance-divisional D/A converter of FIG. 11.

FIG. 12 shows the specific structure of the switch SW20. The switch SW20 includes a transfer gate that includes an n-Mos transistor M1, a p-MOS transistor M20 and an inverter INV1, and an n-MOS transistor M30 connected in series to the transfer gate. The switch control circuit 6000 causes the output corresponding to the input data D1 to be in high impedance condition by switching off the n-MOS transistor M30. The other switches corresponding to the other input data can similarly be set in a high impedance condition.

In FIG. 11 and FIG. 12, the switch control circuit 6000 is independently provided, and in FIG. 12, the special transistor (M30) for generating a high impedance condition is provided. However, the arrangement is not always limited to these elements. For example, in FIG. 11 and FIG. 12, by using a reset signal or similar signal to forcibly fix the input data D1 to D8 to "0", the switch (SW20) in FIG. 11 and the transfer gates (M10, M20) in FIG. 12 can be switched off to set the output in a high impedance condition.

Resistor Ladder D/A Converter

Figure 13:
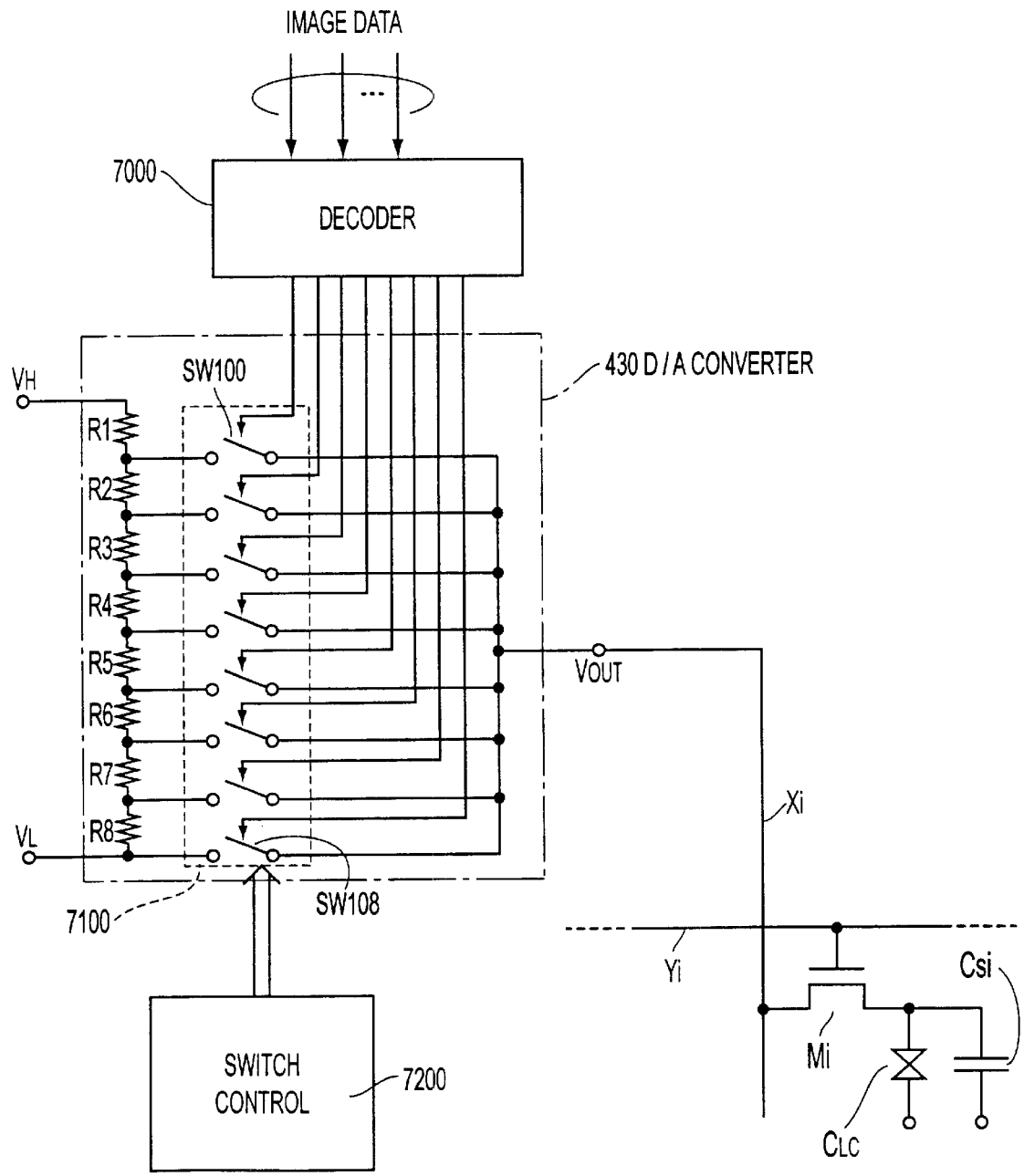
FIG. 13 is a diagram illustrating an outline of a structural example of a resistance-divisional D/A converter usable in the invention.

The D/A converter 430 shown in FIG. 13 obtains a conversion output $V_{OUT}$ by controlling the opening and closing of switches SW100 to SW108 to select and extract a divided voltage obtained from each of the common connection points of resistors R1 to R8 connected in series.

The opening and closing of the switches SW100 to SW108 is determined by the output of a decoder 7000. The switches SW100 to SW108 (switch group 7100) are controlled by a switch control circuit 7200 to be simultaneously opened, and the output can be set in a high impedance condition.

PWN D/A Converter

Figure 14:
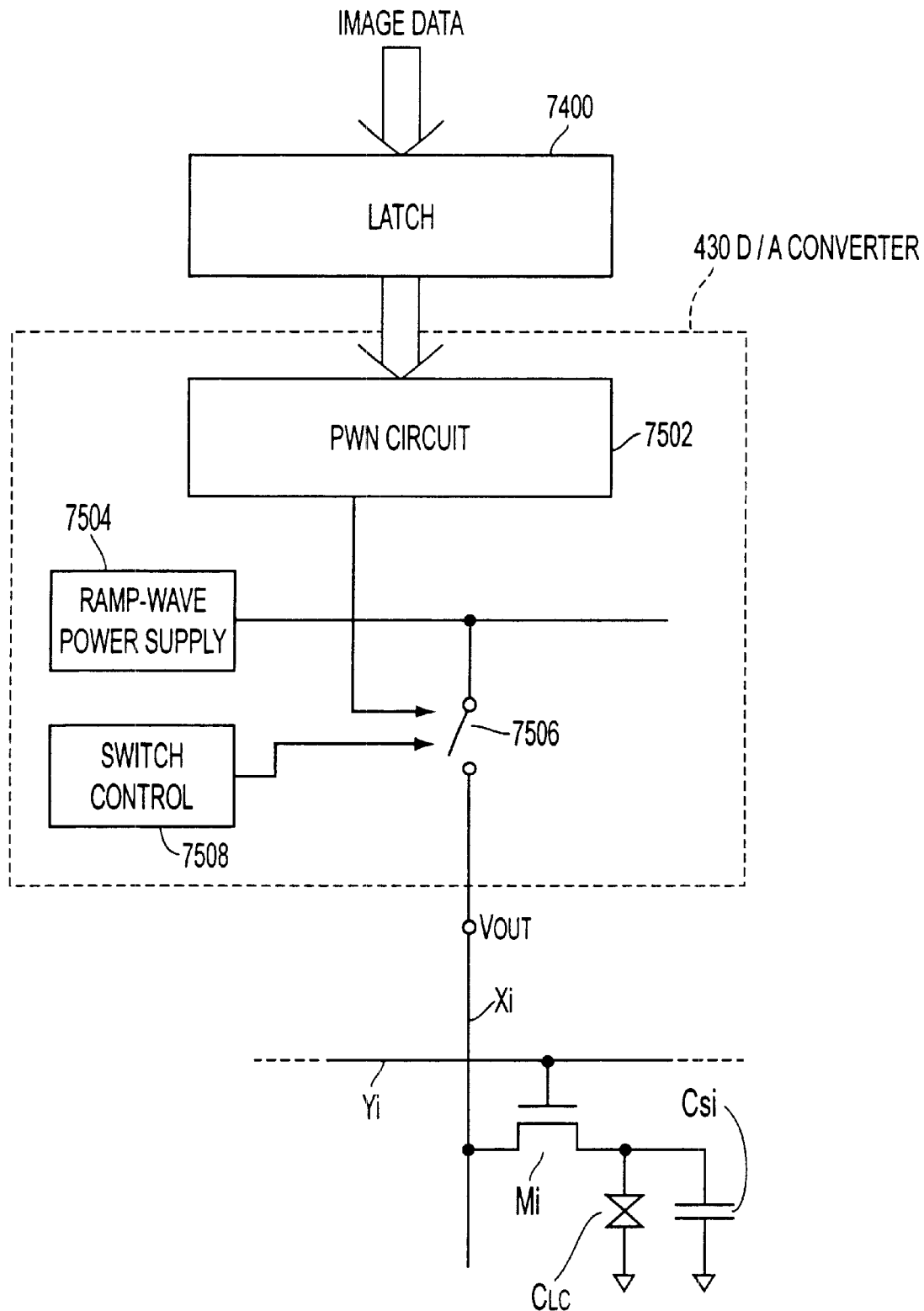
FIG. 14 is a diagram illustrating an outline of a structural example of a PWM D/A converter usable in the invention.

The D/A converter 430 in FIG. 14 uses a PWM circuit 7502 to generate a pulse signal having a pulse width corresponding to the value of input data, and obtains a conversion output $V_{OUT}$ by using the pulse width to control the on-duration, i.e., closed condition duration, of a switch 7506. Reference numeral 7504 denotes a ramp-wave power supply, and reference numeral 7400 denotes a latch circuit in which image data are temporarily stored. In addition, the control by the switch control circuit 7508 enables the switch 7506 to be forcibly opened, and the output to be in a high impedance condition.

③ Structure of Inspection Circuit

Figure 15C:
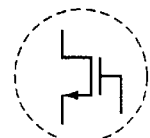
FIG. 15(c) is an enlarged view of MOS transistor used analog switch.
Figure 15A:
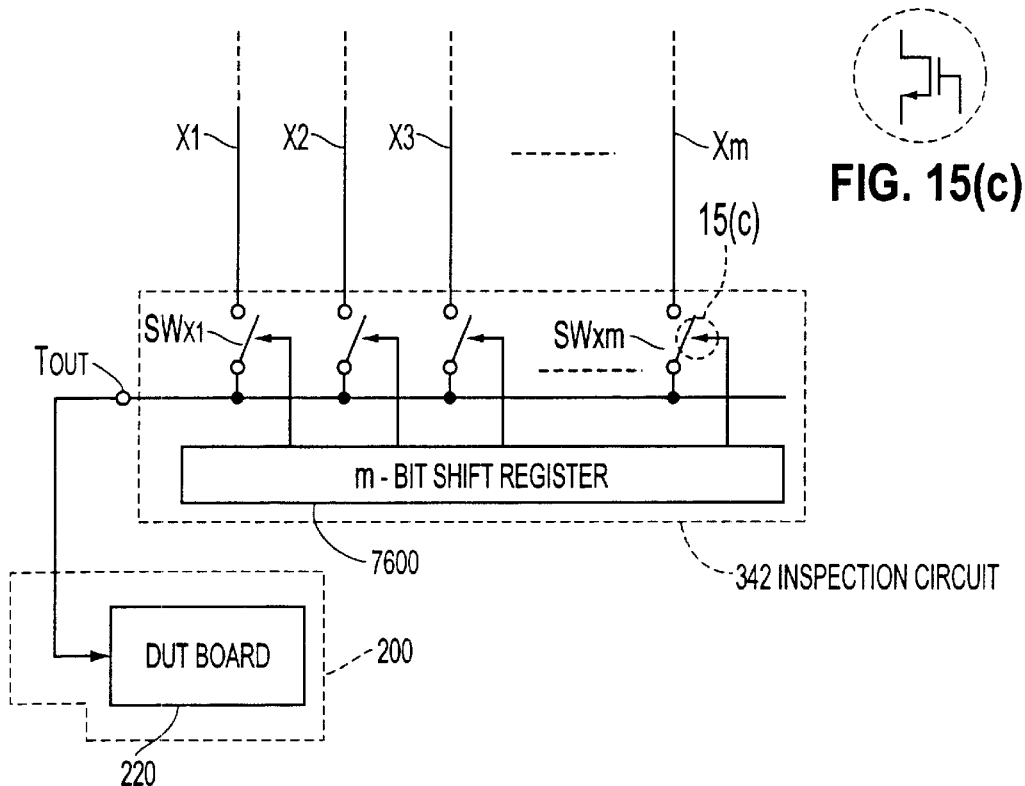
FIG. 15(a) and FIG. 15(b) are diagrams illustrating an outline of one example of the inspection circuits shown in FIG. 1 and FIG. 2, respectively.
Figure 15B:
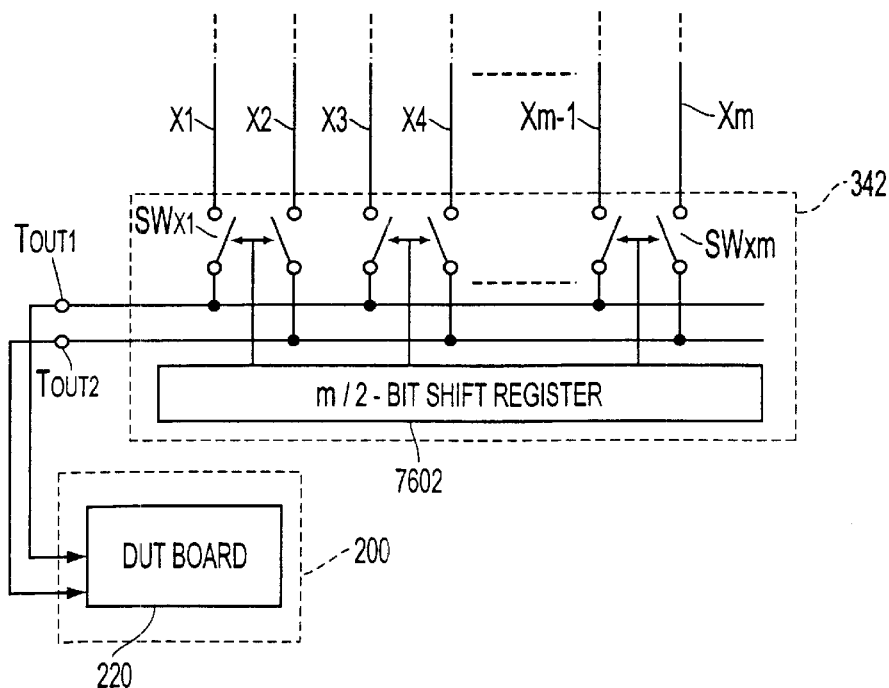
Figure 16:
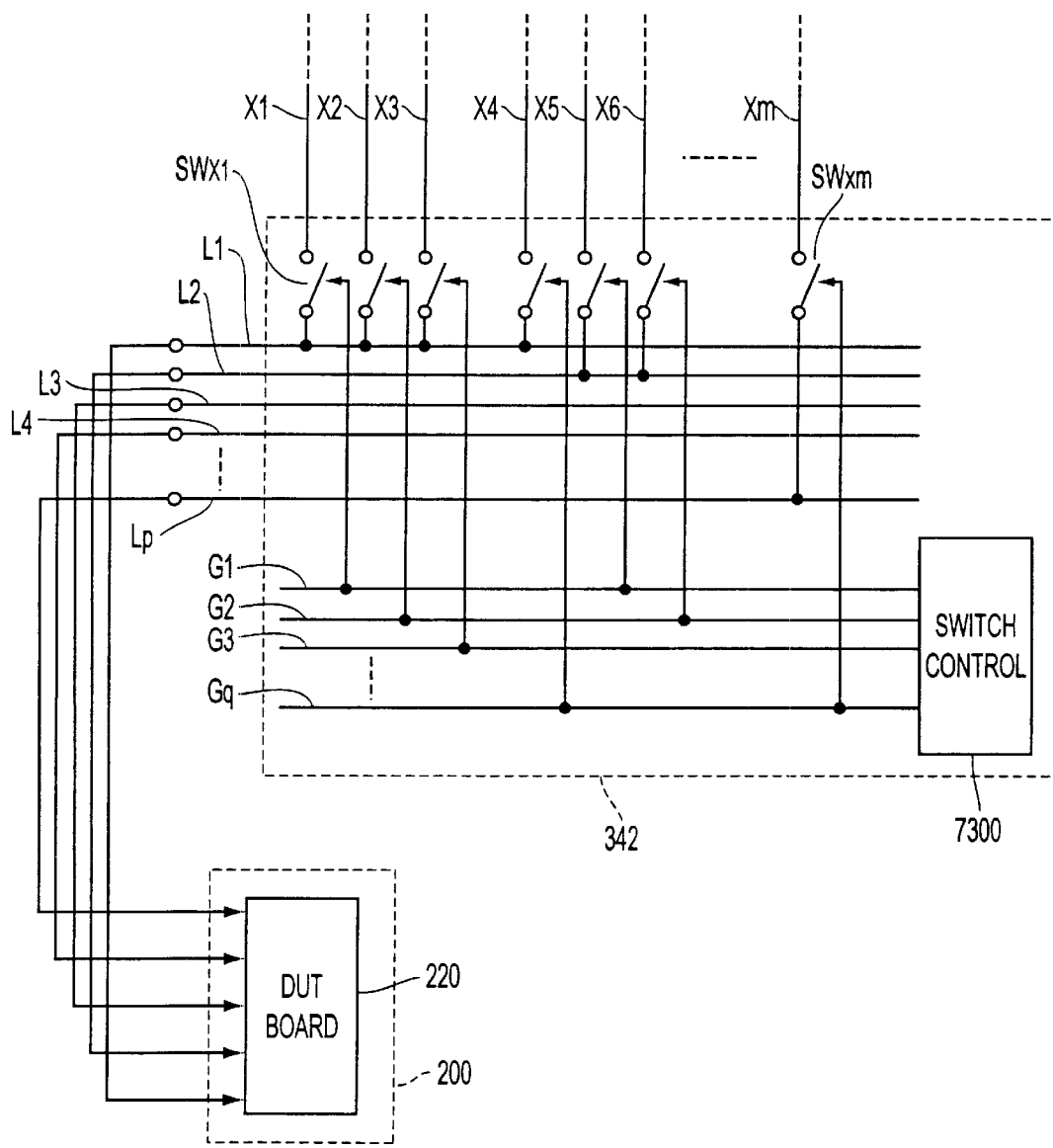
FIG. 16 is a diagram illustrating an outline of another example of the structure of the inspection circuits shown in FIG. 1 and FIG. 2.

Those elements shown in FIGS. 15(a) and FIG. 15(b), and FIG. 16, are usable as the inspection circuit 340 shown in FIG. 2. The "inspection circuit" means that it is used for inspection, but is not intended to be used to drive the data lines like the data line driver. However, the inspection circuit may have a structure to be used for a purpose other than inspection, or the whole circuit can be used for a purpose other than inspection.

In the inspection circuit 342 shown in FIG. 15(a), MOS transistor-used analog switches $SW_{x1}$ to $SW_{xm}$ are provided corresponding to each of data lines X1 to Xm, and the point-at-a-time scanning of the analog switches $SW_{x1}$ to $SW_{xm}$ is performed with outputs from a shift register 7600, whereby basic signals to be a basis of the inspection can be obtained successively from an output terminal $T_{OUT}$. The basic signals are sent to the DUT board 220 in the full-autoprover 200.

An enlarged view of MOS transistor used analog switch $SW_{xm}$ is shown in FIG. 15(c).

In FIG. 15(b), one output from the shift register 7602 drives two analog switches ($SW_{x1}$ to $SW_{xm}$), which is basically similar to that shown in FIG. 15(a) with respect to the fact that point-at-a-time scanning is employed. By simultaneously driving two analog switches, the number of bits, i.e., the number of stages, only needs m/2 bits. In addition, the basic signals are obtained from two terminals $T_{OUT1}$ and $T_{OUT2}$.

In the inspection circuit 342 shown in FIG. 16, a technique different from point-at-a-time scanning is employed. In other words, the technique is that, when m analog switches $SW_{x1}$ to $SW_{xm}$ are driven, p analog switches are simultaneously driven and the driving is repeatedly performed q times, whereby the driving of a total of m (m=p×q) analog switches is realized.

A switch control circuit 7300 successively switches on control lines G1 to Gq, and whenever each control line is switched on, basic signals are simultaneously obtained from output lines L1 to Lp.

Since any of the above-described inspection circuits does not need a data-line driving ability, and has no requirement of high-speed driving for image display, its transistor size can be small, and it basically requires only a minimum operable ability. Accordingly, the area that it occupies can be extremely reduced, and it can be formed on a TFT substrate.

Figure 3:
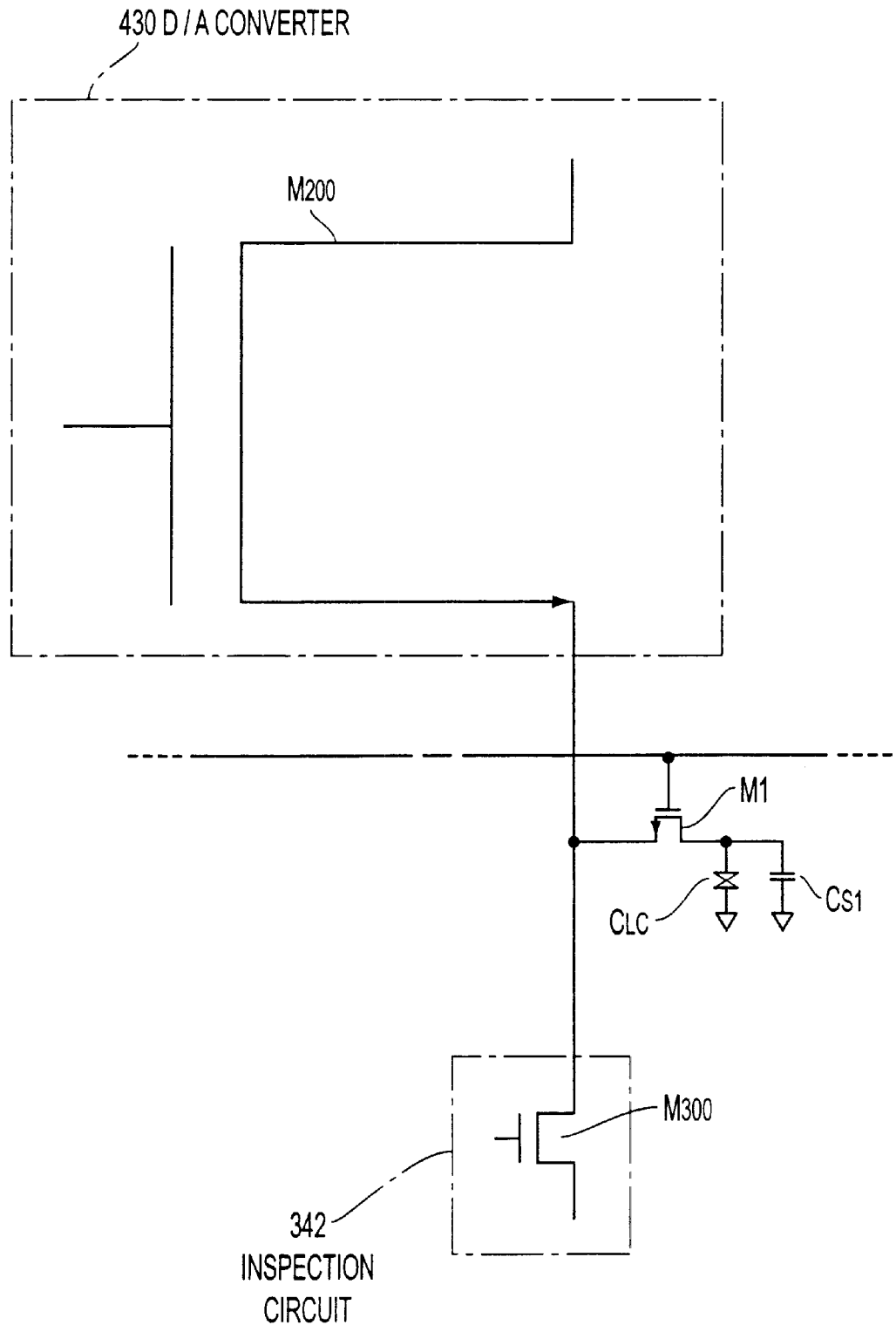
FIG. 3 is a chart showing the schematic comparison between the size of a transistor included in the D/A converter of FIG. 2 and the size of a transistor included in the inspection circuit of FIG. 2.

FIG. 3 shows the comparison between the size of a MOS transistor at the output stage of the D/A converter 430 based on the condition that the D/A converter can perform point-at-a-time driving, and the size of a MOS transistor constituting the inspection circuit 342.

In other words, the channel width (W) of the MOS transistor M200 constituting the D/A converter 430, which is capable of point-at-a-time driving, needs at least 1000 $\mu$m or more. Conversely, the channel width (W) of the MOS transistor M300 constituting the inspection circuit 342 is preferably 100 $\mu$m or less. In other words, the size, which is necessary for the inspection-circuit transistor, is 1/10 or less.

As described above, since the small transistor size and the reduced occupied area are allowed, it is possible to dispose at least a part of the inspection circuit 342 in space of the TFT substrate which does not contribute to realize substantial functions such as an image display, in other words, a so-called dead space. Therefore, the enlargement of the TFT substrate and the liquid-crystal display device can be suppressed.

Figure 4:
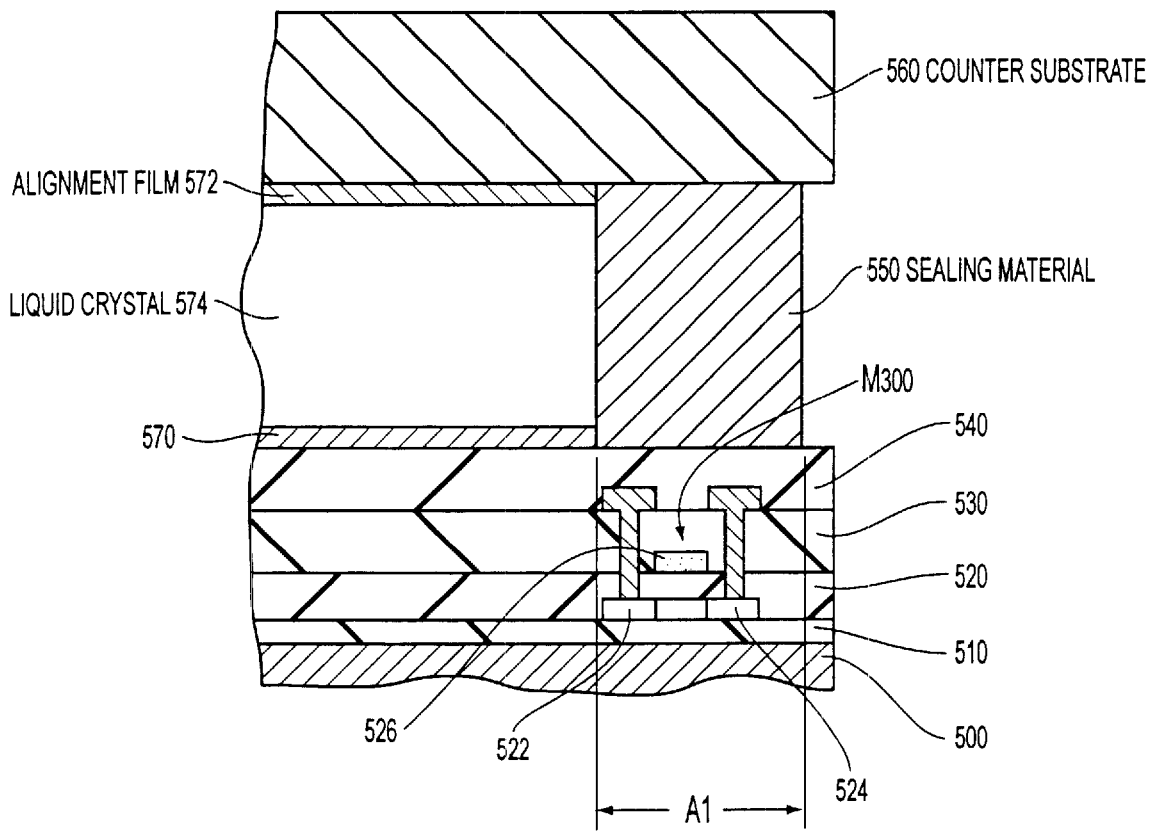
FIG. 4 is a sectional view of a main part of a liquid-crystal display device, showing an example in which the inspection circuit is disposed below a sealing material.
Figure 5:
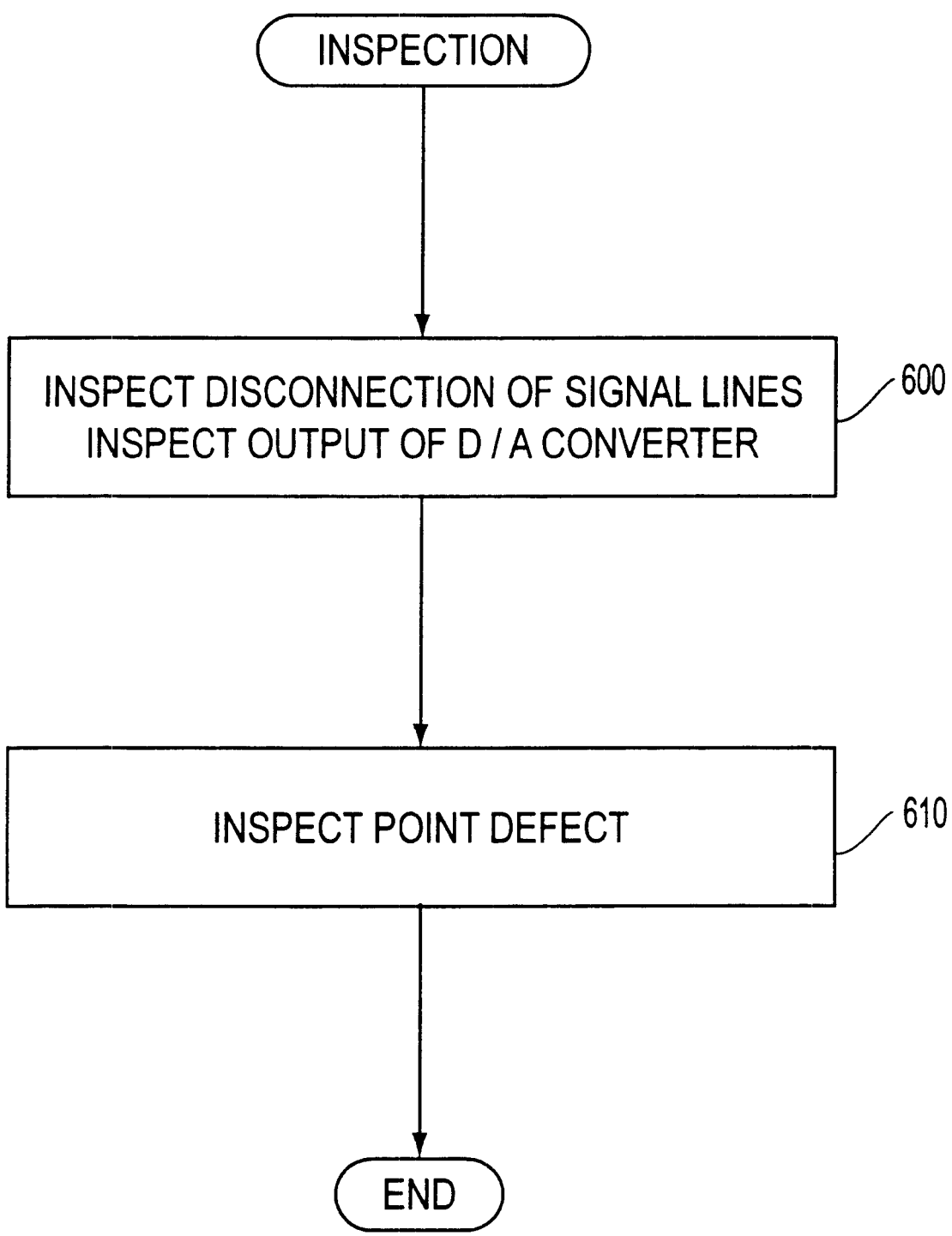
FIG. 5 is a flowchart showing an outline of one embodiment of an active-matrix-substrate inspecting method of the invention.

For example, as shown in FIG. 4, the inspection circuit 342 can be disposed in a sealing position formed by the sealing material in a TFT-substrate panel production process. In FIG. 4, to facilitate ease of understanding, the sectional structure of a completed liquid-crystal display device is shown.

In FIG. 4, reference numeral 500 denotes a glass substrate, reference numeral 510 denotes an $SiO_2$ film, reference numeral 520 denotes a gate-insulating film, reference numerals 530, 540 denote interlayer insulating films, reference numerals 522, 524 denote source-drain layers, and reference numeral 526 denotes a gate electrode.

The MOS transistor M300 constituting the inspection circuit is disposed in a sealing region A1 formed by a sealing material 550. The sealing position formed by the sealing material is a dead space inevitably generated in the active matrix substrate. By disposing the inspection circuit in this space, the space can be used effectively.

In FIG. 4, reference numeral 560 denotes a counter substrate, reference numeral 570, 572 denote alignment films, and reference numeral 574 denotes liquid crystal.

(4) Process for Inspecting a TFT Substrate

① Outline

A TFT-substrate inspection is broadly divided into a step, i.e., preliminary inspection step, step 600, for detecting disconnections of signal lines and inspecting an output from a D/A converter, and a step, i.e., step 61 0, for inspecting point defects.

The inspection step, i.e., step 600, for detecting disconnections of signal lines and inspecting an output from a D/A converter is an inspection, which is realized by the basic structure of the active matrix substrate (FIG. 1, FIG. 2) of this embodiment. In the inspection, the inspection can performed, in general, by one scanning once by switching on all the outputs of the digital-data-line driver 330 and using the inspection circuit 340 to receive the outputs.

For example, in case that no output signals from the data line driver are transmitted via the data lines, it is determined that the data lines are disconnected, or the data line driver itself has a defect. The step, i.e., step 610, for inspecting point defects will be described below.

② Specific Inspection Process

Figure 6A:
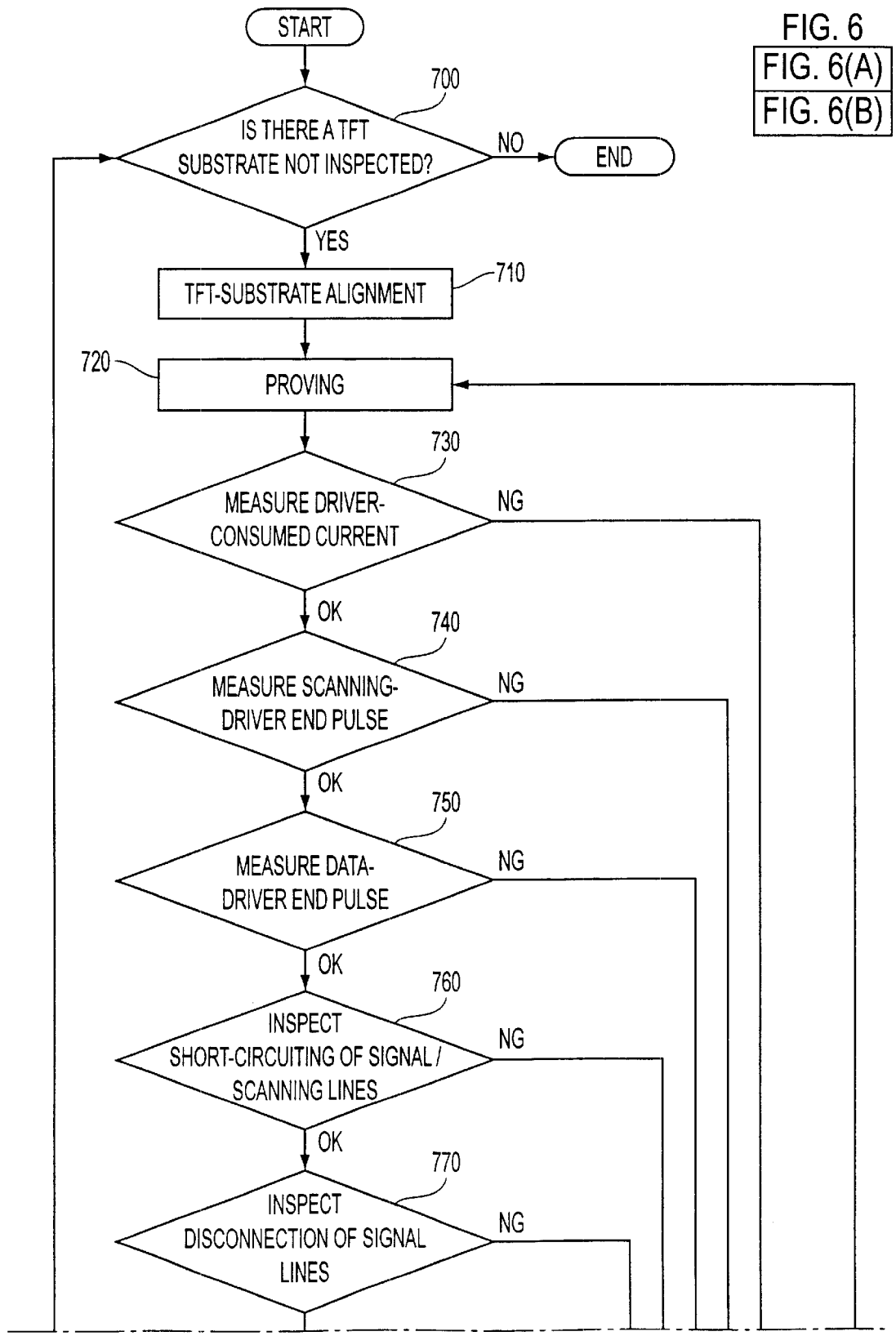
FIG. 6 is a flowchart illustrating more specific details of the active-matrix-substrate inspecting method of the invention.
Figure 6B:
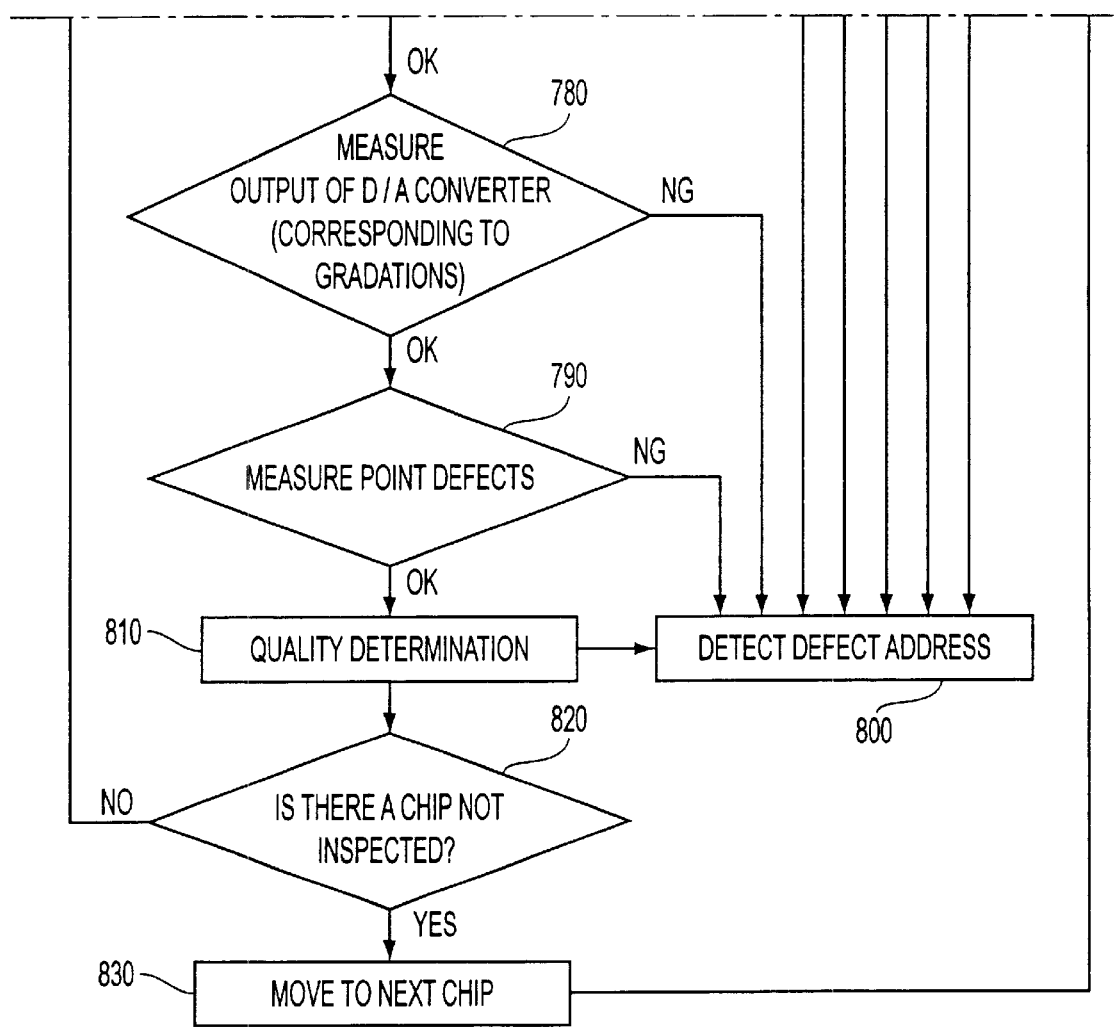

In FIG. 6, an example of a specific inspection process will be shown.

In the flow chart of FIG. 6, the method of inspection in which an object which requires a short period of inspection time is sequentially inspected is used and all the necessary processes are inspected. However, the inspection process is not limited thereto, and in case that a defect is found, it is possible to stop performing the successive inspections. The inspection process shown in FIG. 6 will be described below in order.

At first, determination of whether or not there is a TFT substrate, which has not been inspected, is made, i.e., step 700. If there is a TFT substrate which has not been inspected, the substrate is aligned to, i.e., mounted on, the system shown in FIG. 1, i.e., step 700, and then proving with the full-autoprover 220 shown in FIG. 1 is performed, i.e., step 720.

In addition, a driver-consumed current is measured, i.e., step 730. This step determines whether a consuming current flowing in the data lines and a power supply for the scanning driver (and the inspection circuit) is in a normal range or not. If short-circuiting occurs in the power supply, an excess current flows, then the determination can be performed.

Next, an end pulse of the scanning line driver is measured, i.e., step 740. In other words, a pulse is input in the first stage of the shift register, and determination of whether the pulse is output from the final stage at predetermined timing is performed. Since the pulse is a digital signal, instant determination can be performed.

Next, an end pulse of the data line driver is measured similarly to the case of the scanning line driver, i.e., step 750.

Next, short-circuit inspection of the data lines, i.e., signal lines, and the scanning lines is executed, i.e., step 760.

In other words, a current flowing from the scanning line driver to the inspection circuit is measured with all the outputs of the scanning driver set to a high level, and each switch in the inspection circuit switched on. If short-circuiting occurs in the interconnection, an excess current flows.

Next, disconnection inspection of the data lines, i.e., signal line, and the scanning lines is executed, i.e., step 770.

In other words, with all the outputs of the digital driver set to a high level, a current change is detected by successively closing the switches of the inspection circuit. If there is a disconnection, the flowing current decreases, which enables the detection.

Next, the outputs of the D/A converter are measured, i.e., step 780.

Before point-defect inspection is performed, all the outputs of the D/A converter are inspected. In this inspection, in order to enhance its precision, it is preferable to check whether or not the output levels of signals having a plurality of gray scale: white, black and intermediate tone, are proper.

Specifically, a voltage set at a predetermined level is output to all the data lines, i.e., signal lines. Then the output of the D/A converter is set to have a high impedance condition after a given time, and the voltage of each inspection circuit, i.e., signal line, is detected using the inspection circuit.

Next, point-defect measurement is performed, i.e., step 790.

Figure 7:
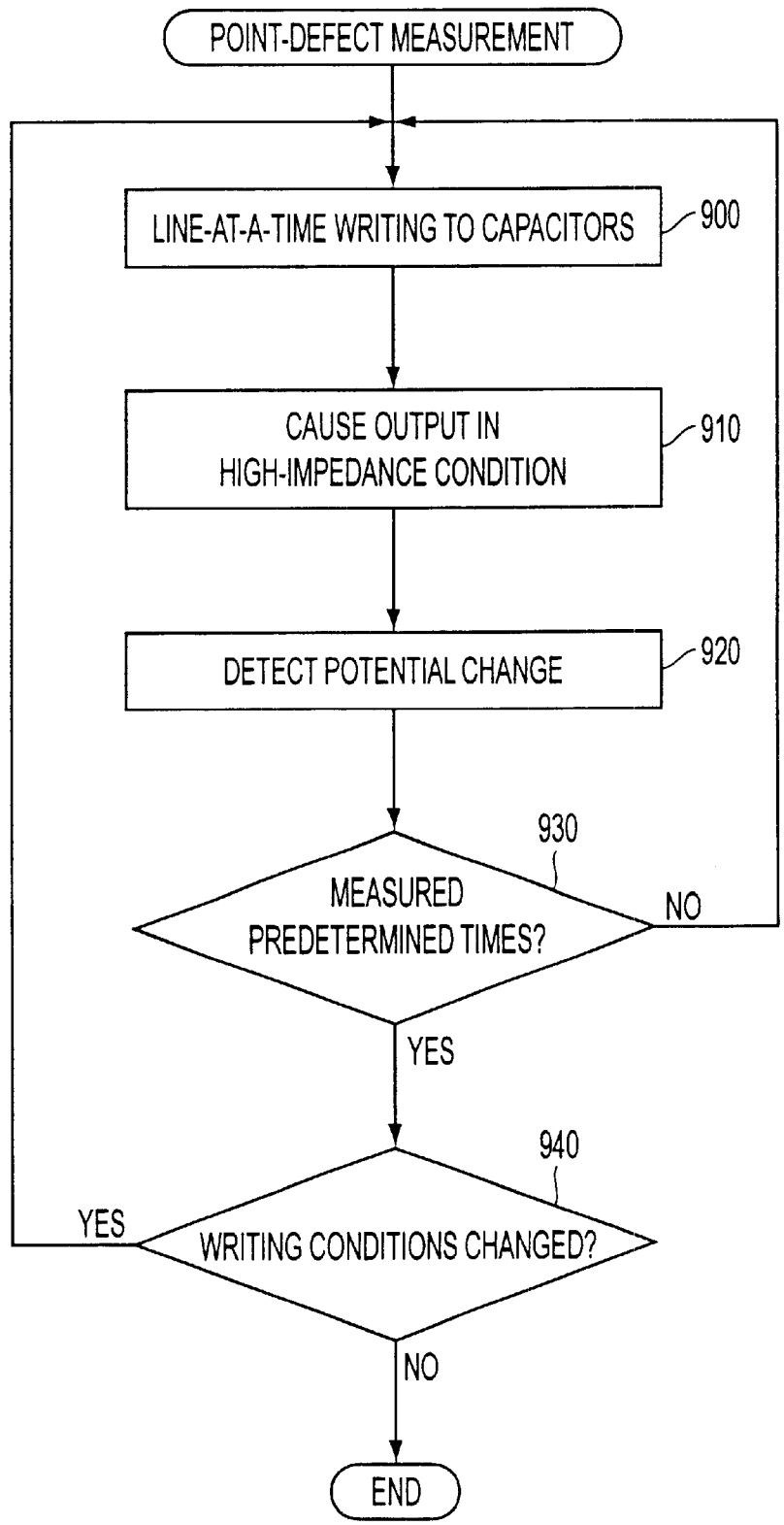
FIG. 7 is a flowchart showing more specific details of the point defect measurement of FIG. 6.

More specifically, this point-defect measurement is performed according to the process shown in FIG. 7. In other words, signals are written in the storage capacitors in the pixels, i.e., step 900, by switching on all output of the digital data line driver so that the voltage set at a predetermined level is output to all the data lines, i.e., signal lines. Next, the outputs of the D/A converters of the digital-data-line driver are set to be a high impedance condition, i.e., step 910. Next, a fluctuation of potential for each pixel is detected, i.e., step 920, by selecting the scanning lines one by one with the switches closed. In addition, if necessary, a plurality of detections, i.e., step 930, and the detections with different writing conditions, i.e., step 940, are executed.

If an abnormality, i.e., defect, is found in any of the above steps, the defect address is detected if needed, and it is used as basic data for status determination, i.e., step 800 shown in FIG. 6.

Since the basic data to be a basis for the detection are obtained in the above steps, comprehensive status determination is performed based on the basic data, i.e., step 810, shown in FIG. 6.

Figure 8:
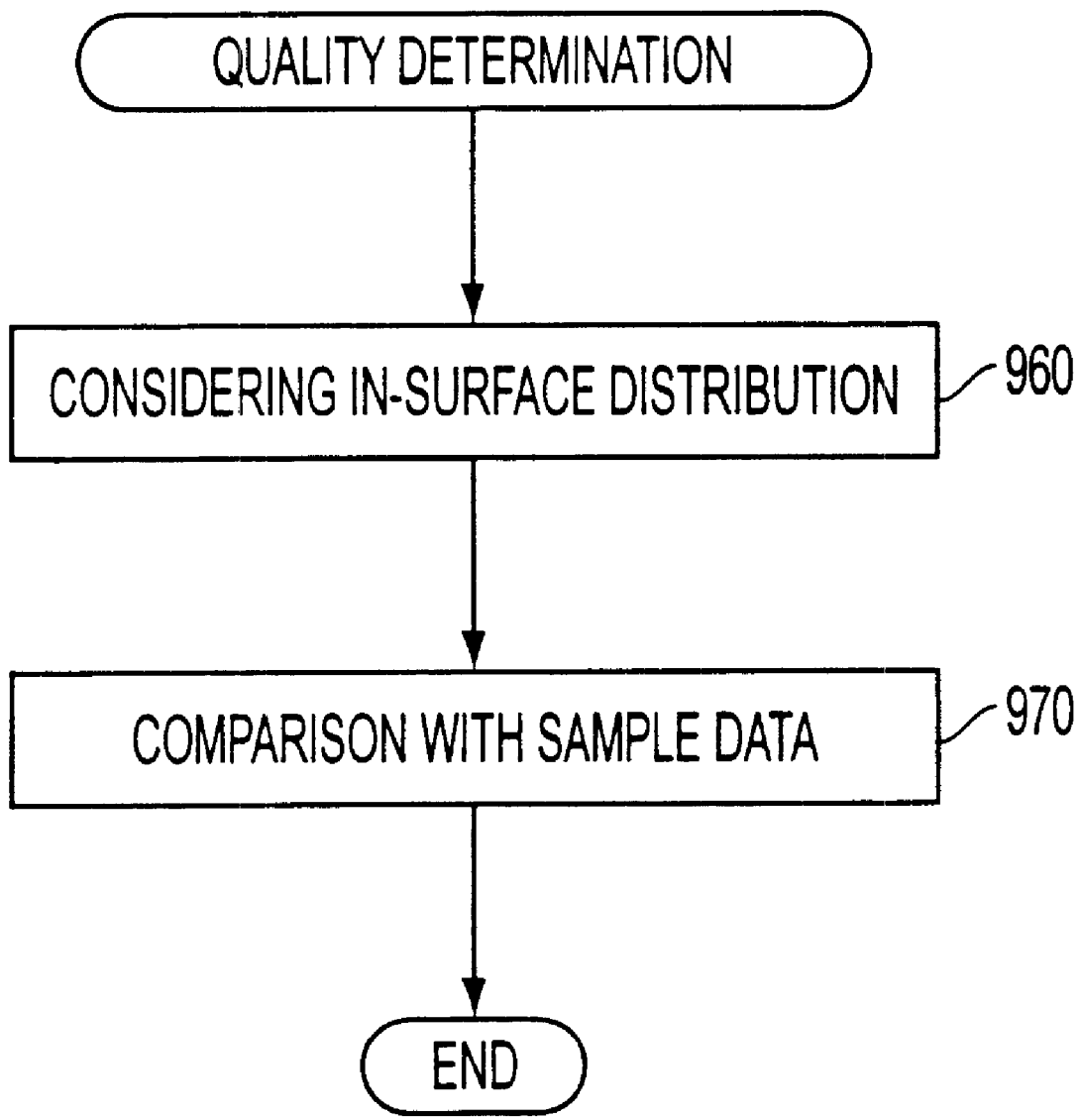
FIG. 8 is a flowchart showing more specific details of the status determination of FIG. 6.

For example, the status determination is comprehensively performed such that, as shown in FIG. 8, the two-dimensional distribution of the basic data on the TFT substrate is considered to determine whether or not a portion, i.e., significant point, showing a numerical value extremely different from that of the neighborhood, i.e., step 960, and an abnormality is searched by using sample data for comparison, i.e., step 970.

In addition, the above inspection steps are performed in order for other chips, which have not been inspected, i.e., steps 820, 830 shown in FIG. 6.

As described above, according to this embodiment, conforming-article inspection of an active matrix substrate with a built-in digital data-line driver can precisely be performed in a short amount of time.

Second Embodiment

A second embodiment of the invention will be described using FIG. 17.

A feature of this embodiment is that digital-data-line drivers and inspection circuits are disposed so as to be divided into upward and downward, and the upward and downward separate circuits are disposed well closely each other to realize a compact structure.

Figure 17:
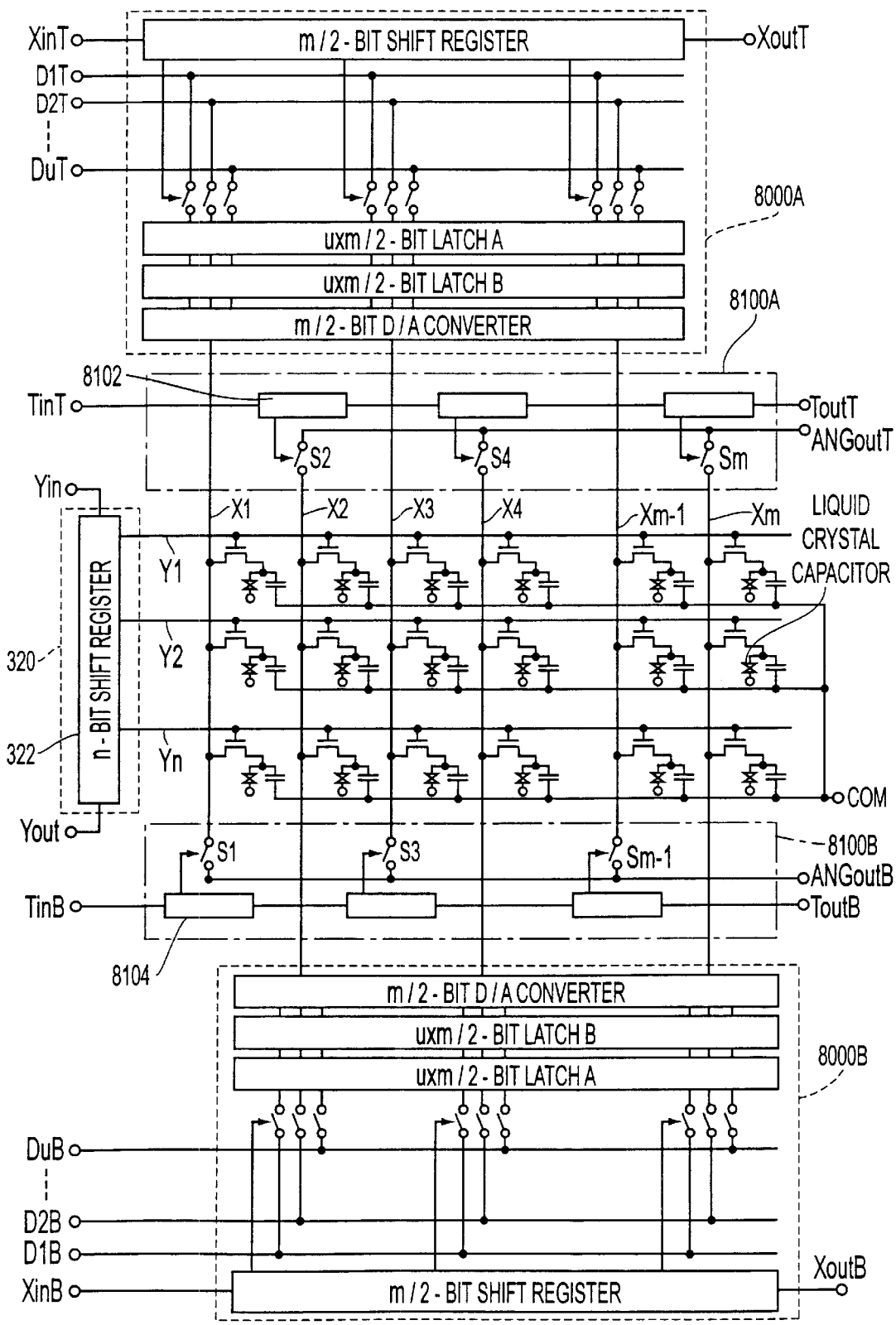
FIG. 17 is a diagram showing another example of a structure of the circuits mounted on the active matrix substrate of the invention.

As shown in FIG. 17, the digital-data-line drivers include two drivers: a first driver 8000A and a second driver 8000B. The structure of the digital-data-line driver itself is identical to that shown in FIG. 2. However, dividing the digital-data-line driver into two parts causes the number of bits of each driver to be ½ of that shown in FIG. 2.

In addition, the inspection circuits include two circuits: a first circuit 8100A and a second circuit 8100B. The first circuit 8100A is connected to even data lines (X2, X4 to Xm), and the second circuit 8100B is connected to odd data lines (X1, X3 to Xm-1). In FIG. 17, reference numerals S1, S2, S3, S4, Sm and Sm-1 denote analog switches, and reference numerals 8102 and 8104 denote one-stage shift registers.

By dividing drivers and inspection circuits as described in this embodiment, various advantages, described below, can be obtained.

In other words, dividing drivers and inspection circuits enables the number of devices constituting each circuit to be reduced in half, the occupied area to be reduced by that much, and the devices to be arranged with clearance.

In addition, halving the number of shift-register stages also halves the operating frequency, which is advantageous in circuit design.

Moreover, circuit division leads to the uniform arrangement of circuits disposed around pixels, which enables the efficient use of a dead space. For example, this is advantageous to utilize the dead space right under the sealing material, described in FIG. 4.

In other words, the sealing material is provided so that its uniform width touches the periphery of the substrate, without exerting an excess stress on the substrate. Accordingly, the divided circuits and the reduced number of circuit devices are usefull in enhancing the efficiency of using the dead space right under the sealing material.

In particular, the device size of inspection-circuits is smaller than the driver device size. Thus, dividing the inspection circuit reduces the space, which is advantageous in layout design.

Figure 19:
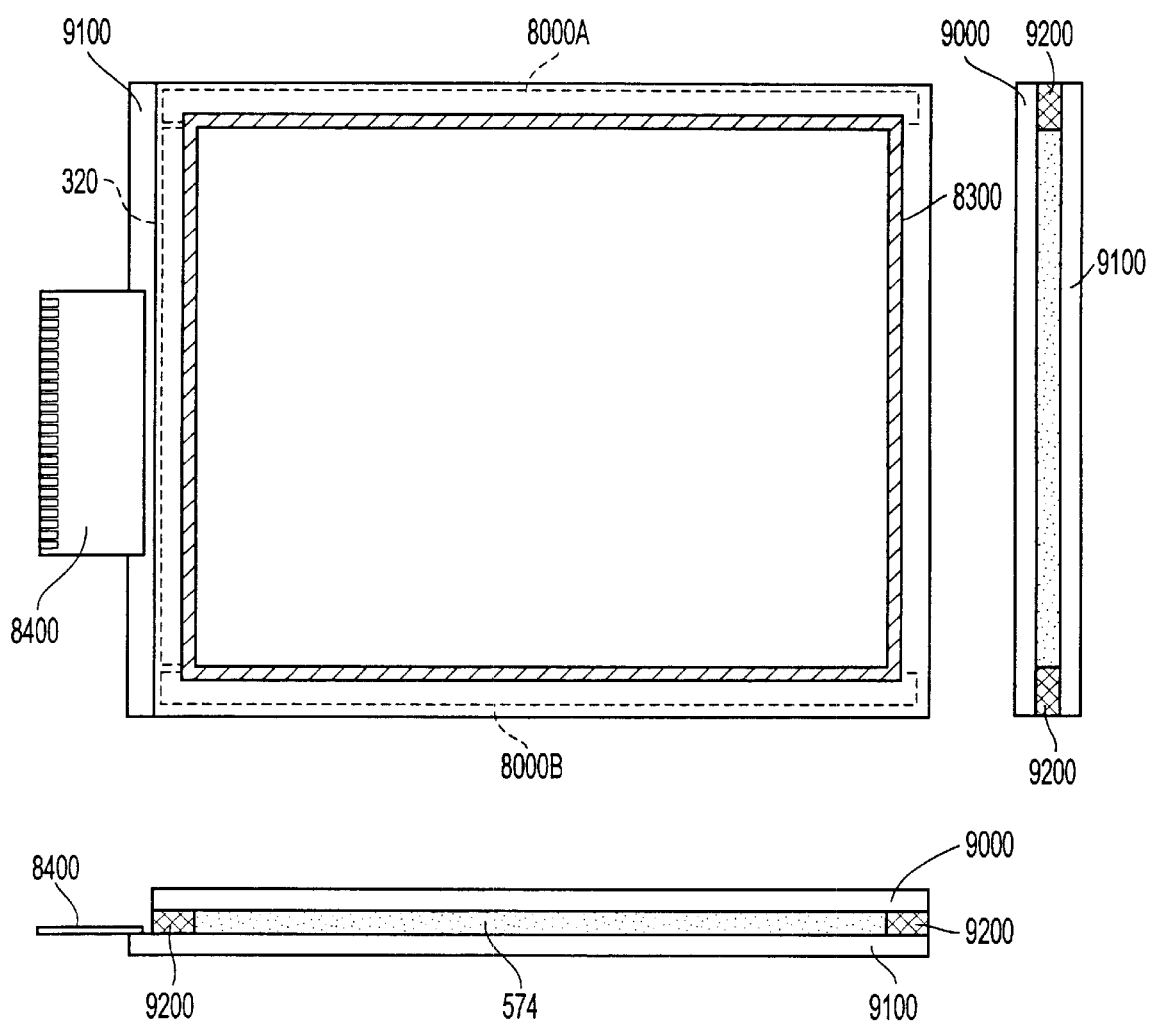

In FIG. 19, an example of the arrangement of an inspection circuit, etc. on an active matrix substrate, i.e., TFT substrate, is shown. FIG. 19 shows not only the layout of drivers, etc. on the active matrix substrate, but also vertically sectional and transversely sectional surfaces of a liquid crystal panel including the TFT substrate.

In FIG. 19, reference numeral 9100 denotes an active matrix substrate, i.e., TFT substrate, reference numerals 8000A and 8000B denote a digital-data-line driver and an inspection circuit, and reference numeral 320 denotes a scanning line driver. In addition, reference numeral 8300 denotes a light-shielding pattern, in which there is an active matrix unit, i.e., pixels. Reference numeral 8400 denotes a mounting terminal unit, reference numeral 9200 denotes a sealing material, reference numeral 574 denotes liquid crystal, and reference numeral 9000 denotes an opposite substrate, i.e., color filter-formed substrate.

As is clear from FIG. 19, any of the scanning line driver, the data line driver and the inspection circuit is disposed effectively utilizing the dead spaces around the active matrix substrate. Accordingly, this arrangement is adapted to effectively use the dead space in the sealing position by the sealing material.

Figure 18:
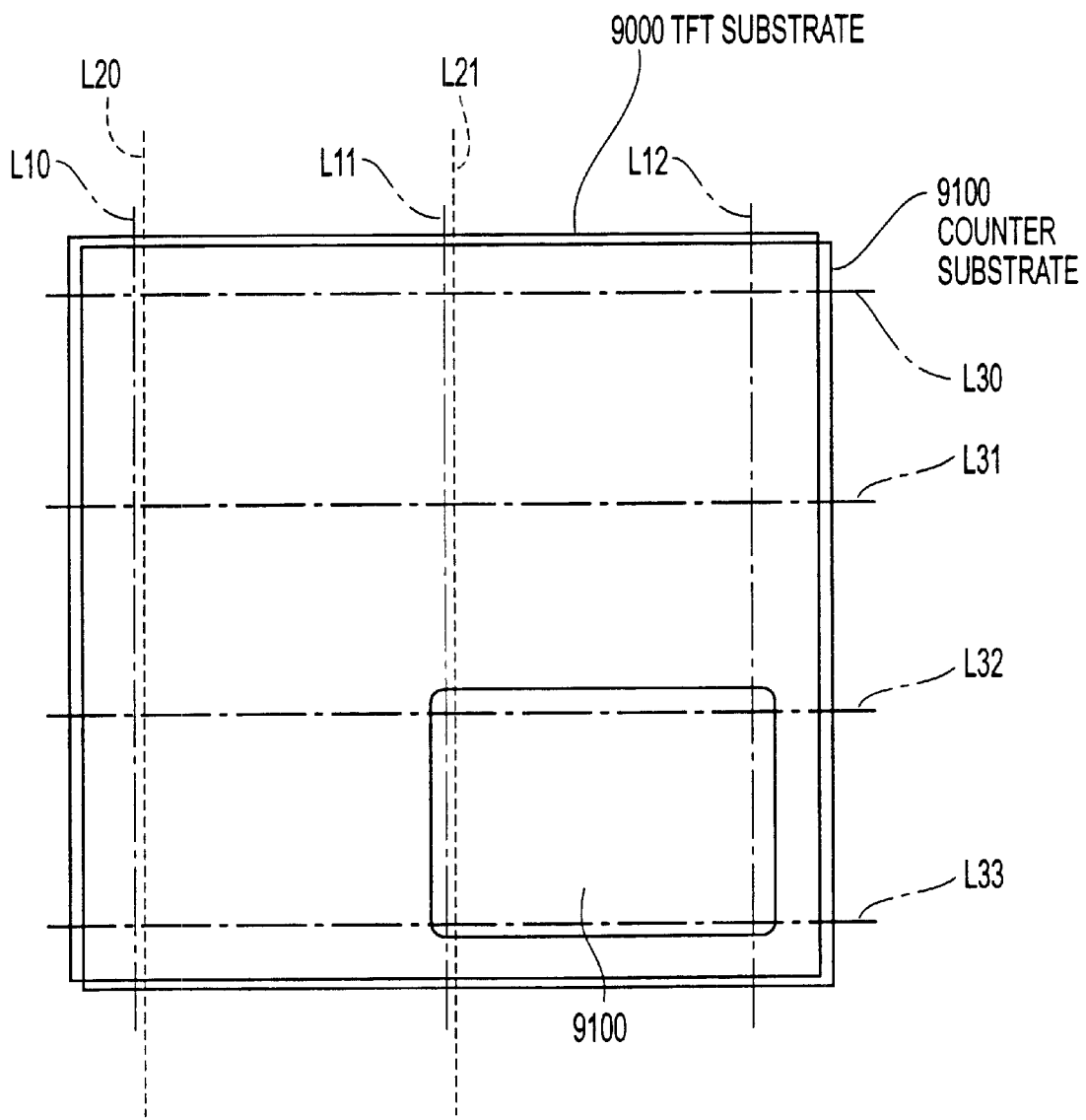
FIG. 18 is a chart showing positions used when a glass substrate is cut in order to produce an active matrix substrate.

The liquid crystal panel, i.e., active matrix substrate 9100, shown in FIG. 19 is produced through a cutting step, for example, as shown in FIG. 18.

In other words, in FIG. 18, an active matrix substrate, i.e., counter substrate, 9100 and an opposite substrate, i.e., TFT substrate, 9000 are adhered to each other by a large-size adhering technique, and then they are cut to produce six panels. In FIG. 18, cutting lines, i.e., L10, L11, L30, L31, L32, L33, indicated by alternate long and short dash lines are lines at which the active matrix substrate and the opposite substrate are simultaneously cut. Cutting lines, i.e., L20, L21, indicated by dotted lines are lines at which only the opposite substrate is cut.

Third Embodiment

In this embodiment, a method, i.e., production method using low-temperature polysilicon technique, for producing thin film transistors, i.e., TFT, on an active matrix substrate will be described using FIG. 20 to FIG. 26.

In the process shown in FIG. 20 to FIG. 26, capacitors, i.e., condenser, are also produced. Accordingly, this process can be used not only for the production of an inspection circuit and shift registers of a driver, but also the production of the switched capacitor D/A converter shown in FIG. 11.

Step 1

Figure 20:
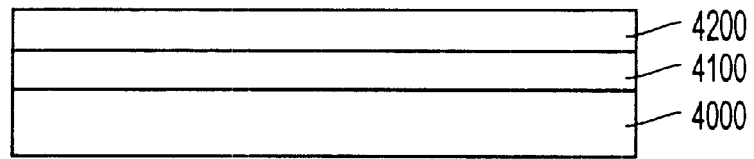
FIG. 20 is a chart showing a first step in an embodiment of an active-matrix-substrate producing method of the invention.

Initially, as shown in FIG. 20, a buffer layer 4100 is formed on a substrate 4000, and an amorphous silicon layer 4200 is formed on the buffer layer 4100.

Step 2

Figure 21:
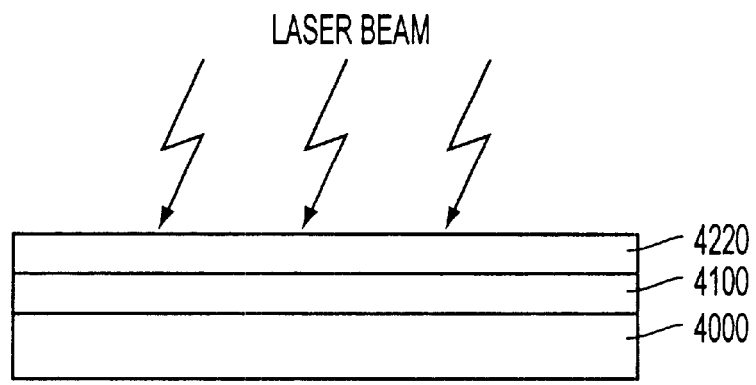
FIG. 21 is a chart showing a second step in the embodiment of the active-matrix-substrate producing method of the invention.

Next, as shown in FIG. 21, annealing is performed by emitting a laser beam to the whole surface of the amorphous silicon layer 4200. As a result, the amorphous silicon is polycrystalized to form a polycrystal silicon layer 4220.

Step 3

Figure 22:
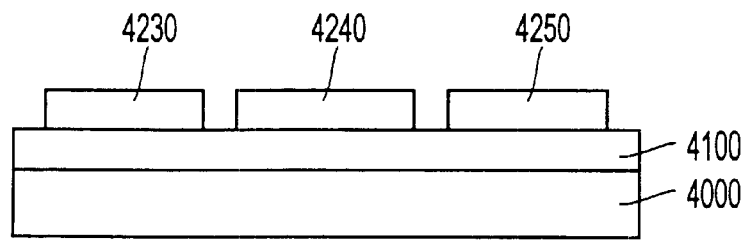
FIG. 22 is a chart showing a third step in the embodiment of the active-matrix-substrate producing method of the invention.

Next, as shown in FIG. 22, island regions 4230, 4240 and 4250 are formed by the patterning of the polycrystal silicon layer 4220. The island regions 4230, 4240 and 4250 are layers in which the active regions, i.e., source drain, of a MOS transistor are formed. In addition, the island region 4250 is a layer to be one electrode of a thin film capacitor.

Step 4

Figure 23:
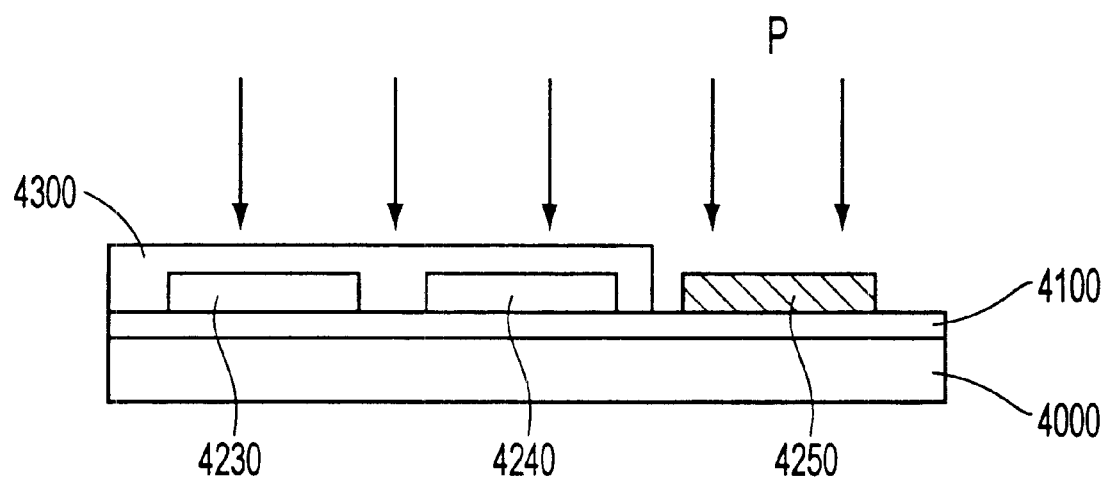
FIG. 23 is a chart showing a fourth step in the embodiment of the active-matrix-substrate producing method of the invention.

Next, as shown in FIG. 23, a mask layer 4300 is formed, and phosphorus (P) ions are doped into only the island region 4250 so that it has a low resistance.

Step 5

Figure 24:
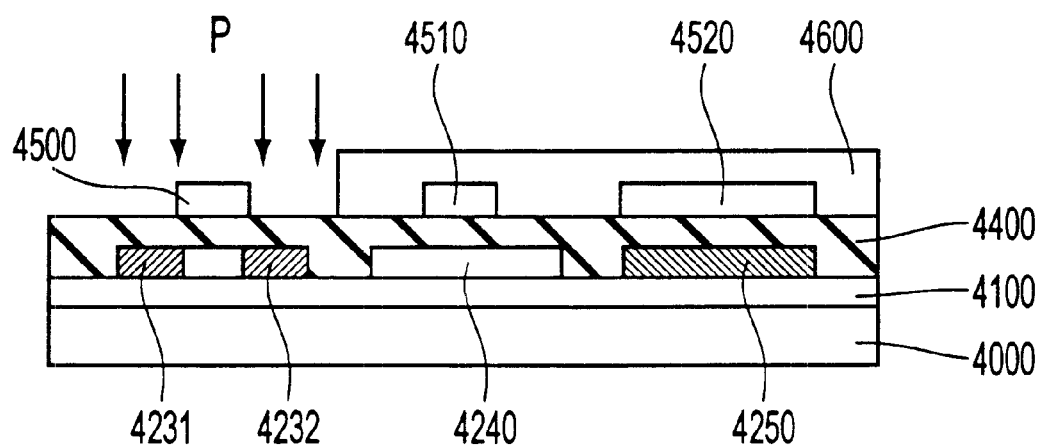
FIG. 24 is a chart showing a fifth step in the embodiment of the active-matrix-substrate producing method of the invention.

Next, as shown in FIG. 24, a gate-insulating film 4400 is formed, and TaN layers 4500, 4510 and 4520 are formed on the gate-insulating film. The TaN layers 4500 and 4510 are layers to be MOS transistor gates, and the TaN layer 4520 is a layer to be another electrode of a thin film capacitor. Subsequently, a mask layer 4600 is formed, and phosphorus (P) ions are doped by self-alignment to form a source layer 4231 and a drain layer 4232 which are an n-type, with the gate TaN layer 4500 as a mask.

Step 6

Figure 25:
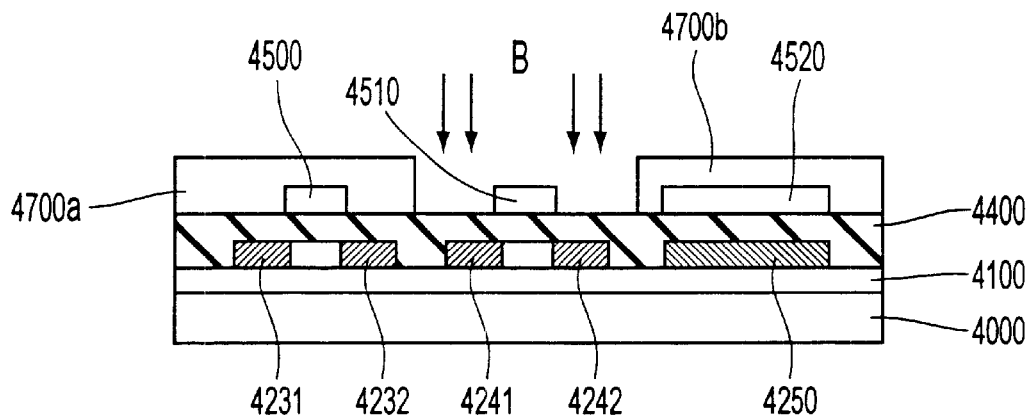
FIG. 25 is a chart showing a sixth step in the embodiment of the active-matrix-substrate producing method of the invention.

Next, as shown in FIG. 25, mask layers 4700*a* and 4700*b* are formed, and boron (B) ions are doped by self-alignment to form a source layer 4241 and a drain layer 4242 which are a p-type, with the gate TaN layer as a mask.

Step 7

Figure 26:
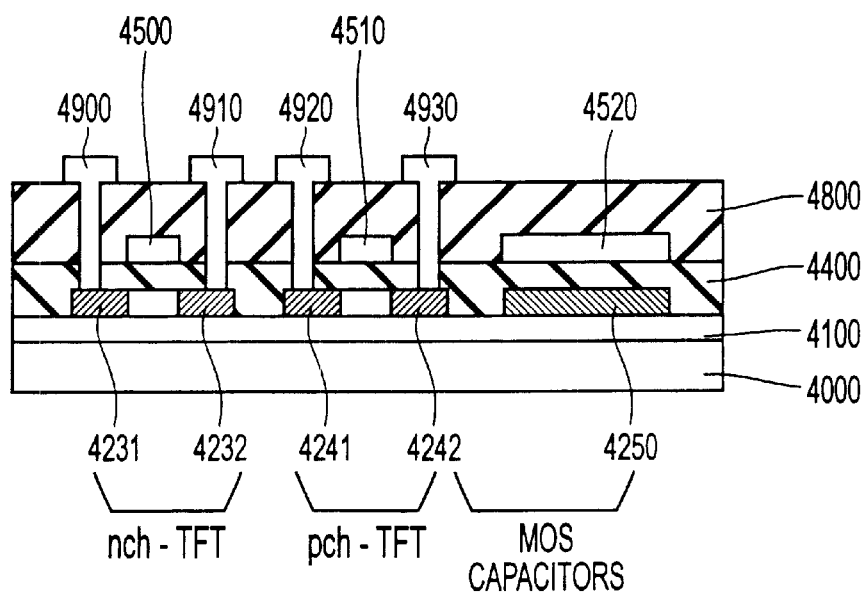
FIG. 26 is a chart showing a seventh step in the embodiment of the active-matrix-substrate producing method of the invention.

Subsequently, as shown in FIG. 26, an interlayer insulating film 4800 is formed and contact holes are formed in the interlayer insulating film before electrode layers 4900, 4910, 4920 and 4930, formed of ITO and Al, are formed. The electrodes are connected to the TaN layers 4500, 4510 and 4520, and the polycrystal silicon layer 4250, as well, via the contact holes, which are not shown in FIG. 26. This completes an n-channel TFT, a p-channel TFT and a MOS capacitor.

By using a manufacturing process in which the steps are in common which was described above, manufacturing can be easier and there is an advantage in cost. Further, since polysilicon has a carrier mobility extremely greater than amorphous silicon, high-speed operation is practical, which is advantageous in increasing circuit-operating speed.

In addition, since conforming-article determination is performed using the above-described inspection method, the reliability of finished products can be extremely increased. As a result, high-quality products can be placed onto the market.

Although the above-described production process uses low-temperature polysilicon TFT techniques, the production method is not always limited to this. For example, if a predetermined circuit-operating speed is guaranteed, a process using amorphous silicon can be used. In addition to TFTs, two-terminal devices such as MIMs can be used as switching devices in pixels.

Fourth Embodiment

In this embodiment, a liquid crystal panel produced using an active matrix substrate of the invention, and an electronic device including the panel, etc. will be described by way of example. Any of these devices constitutes a high-quality apparatus.

Figure 27:
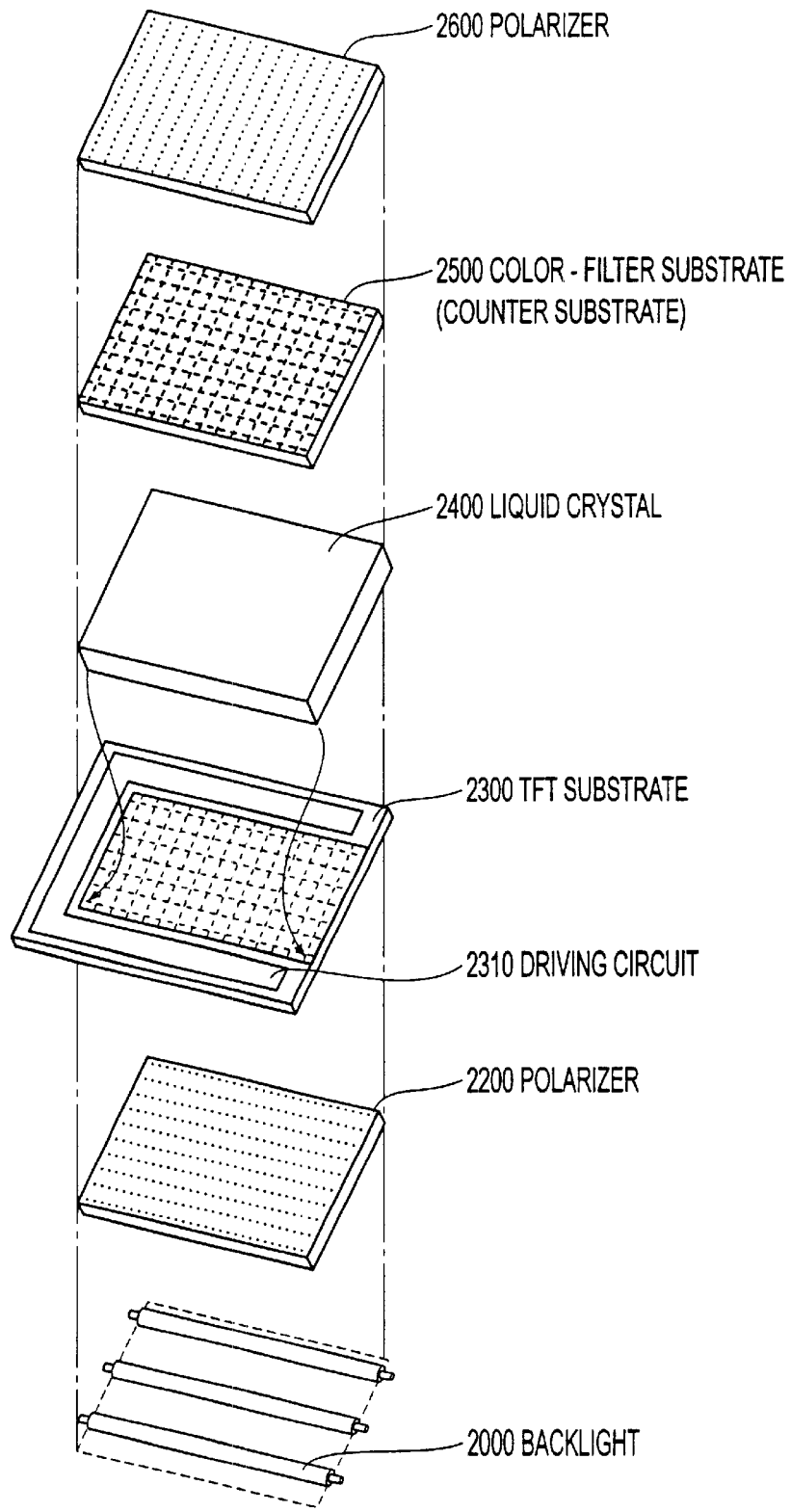
FIG. 27 is a chart showing the structure of a liquid-crystal display device in which an active matrix substrate of the invention is used.

① Liquid-crystal Display Device (FIG. 27)

A liquid-crystal display device comprises a backlight 2000, a polarizer 2200, a TFT substrate 2300, liquid crystal 2400, an opposite substrate, i.e., color-filter substrate, 2500, and a polarizer 2600, for example as shown in FIG. 27. In this embodiment, as described above, a driving circuit 2310 (and an inspection circuit) is (/are) formed on a TFT substrate 1300.

Figure 28:
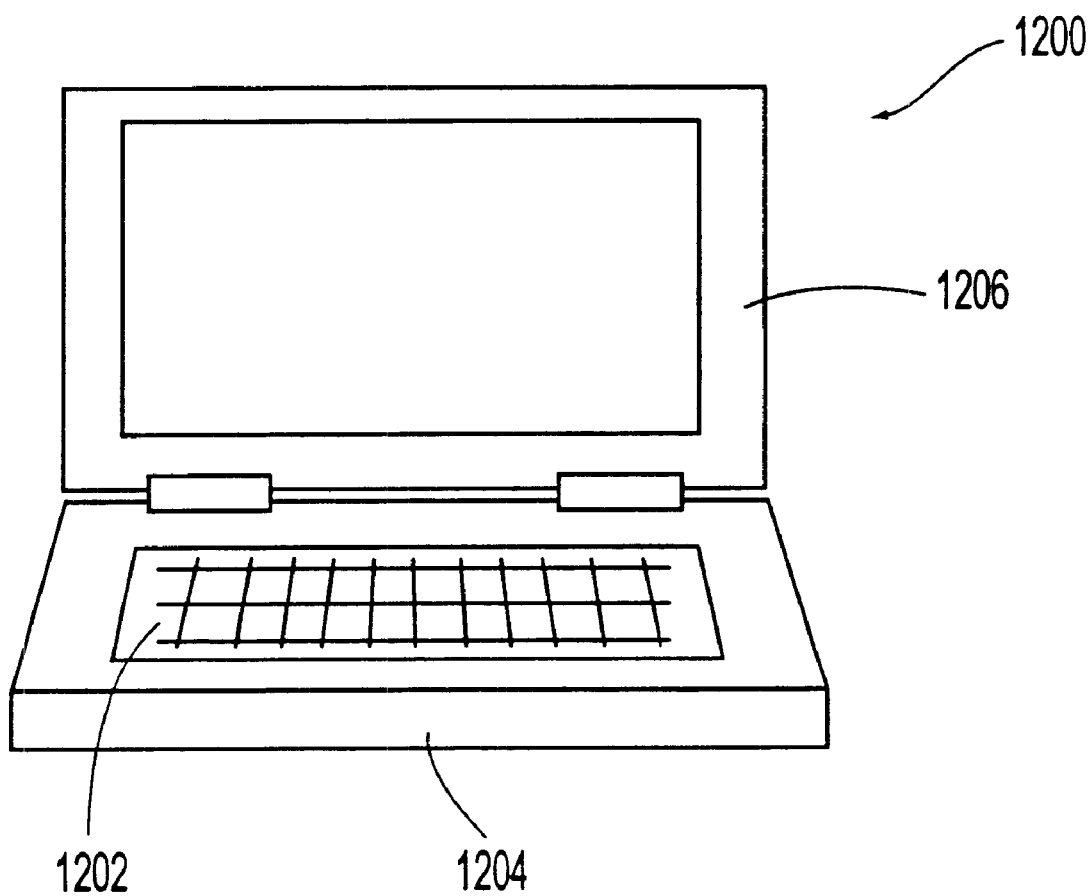
FIG. 28 is a chart showing one example, i.e., a laptop computer, of an electronic apparatus in which an active matrix substrate of the invention is used.

② Personal Computer (FIG. 28)

Personal computer 1200 shown in FIG. 28 has a main unit provided with a keyboard 1202, and a liquid-crystal display screen 1206.

Figure 29:
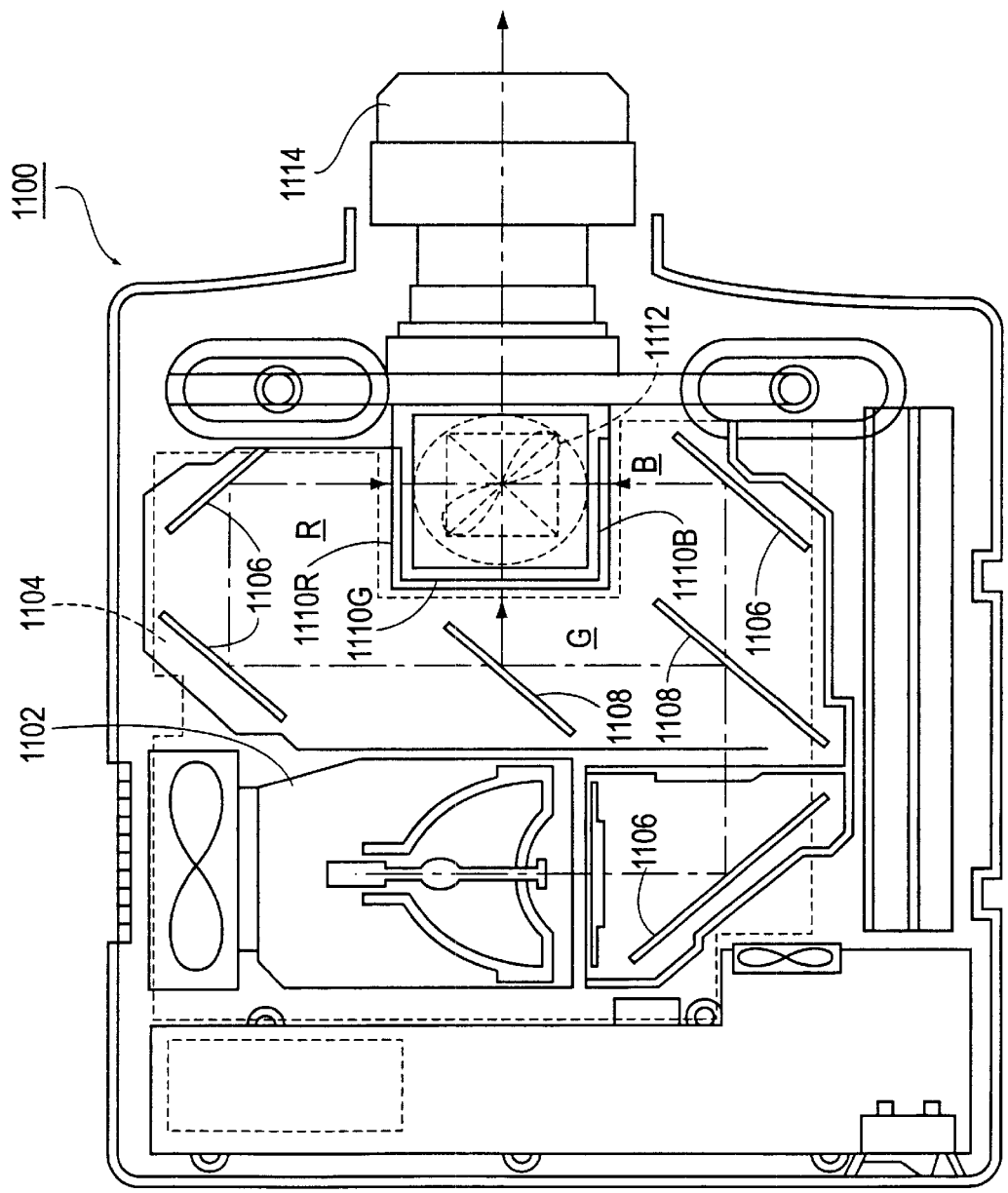
FIG. 29 is a chart showing another example, i.e., a liquid-crystal projector, of the electronic apparatus in which an active matrix substrate of the invention is used.

③ Liquid-crystal Projector (FIG. 29)

Liquid-crystal projector 1100 shown in FIG. 29 is a projection-type projector with a transmissive liquid-crystal panel as a light bulb, and uses, for example, a three-plate-prism-method optical system.

In FIG. 29, in the projector 1100, projection light emitted from a white-light-source lamp unit 1102 is separated by a plurality of mirrors 1106 and two dichroic mirrors 1108 in a light guide 1104 into three primary colors RGB, and each of them is guided to three liquid-crystal panels 1110R, 1110G and 1110B for displaying respective color images. The rays modulated by the respective liquid-crystal panels 1110R, 1110G and 1110B are incident on the dichroic prism 1112 from three directions. In the dichroic prism 1112, the red R and blue B rays are bent at 90°, and the green G ray travels straight. Thus, the respective color images are combined, and a color image is projected onto a screen, etc. through a projection lens 1114.

In addition, electronic apparatuses to which the invention can be applied include an engineering workstation (EWS), a pager or a portable telephone, a word processor, a television, a view-finder or monitor-direct-view video-cassette recorder, an electronic pocketbook, an electronic desk calculator, a car-navigation system, a POS terminal, an apparatus with a touch panel, and so on.

The invention relates to an active-matrix-substrate inspecting method, an active matrix substrate, a liquid crystal device, and an electronic apparatus. In particular, the invention relates to techniques for inspecting a type of active matrix substrate in which a digital type digital data-line driver, i.e., a driver in which a digital signal is input and converted from digital to analog form to output an analog signal for driving data lines, (hereinafter referred to as a "digital driver") is formed on the substrate.

What is claimed is:

1. A active matrix substrate having an inspection circuit for making a defect determination, comprising:

a plurality of scanning lines;

a plurality of data lines, a first driving circuit disposed at one end of the plurality of data lines; and a second driving circuit disposed at the other end of the plurality of data lines, the first driving circuit being connected to one end of the plurality of data lines, the second driving circuit being connected to the other end of at least one of the plurality of data lines, at least one of the first driving circuit and the second driving circuit to enable an output circuit to be in a high impedance condition.

2. The active matrix substrate according to claim 1, the first driving circuit and the second driving circuit having mutually different functions.

3. The active matrix substrate according to claim 1, at least one of the first driving circuit and the second driving circuit having a shift register.

4. The active matrix substrate according to claim 1, at least one of the plurality of data lines being connected to the first driving circuit and the second driving circuit.

5. The active matrix substrate according to claim 1, the first driving circuit comprising a shift register.

6. The active matrix substrate according to claim 1, the first driving circuit comprising an analog switch.

7. The active matrix substrate according to claim 1, the first driving circuit comprising a shift register and a plurality of switches.

8. The active matrix substrate according to claim 1, the second driving circuit comprising a shift register, a bit line, and a latch.

9. The active matrix substrate according to claim 7, the second driving circuit comprising a shift register, a bit line, and a latch.

10. The active matrix substrate according to claim 9, the second driving circuit further comprising D/A converter.

11. An electronic apparatus including the active matrix substrate according to claim 1.

12. An electronic apparatus including the active matrix substrate according to claim 9.

13. A liquid crystal device including the active matrix substrate according to claim 1.

14. An electronic apparatus including the liquid crystal device according to claim 13.

15. A method of inspecting an active matrix substrate having at least one scanning line, at east one data line, a first circuit and a second circuit, tire first circuit being a driving circuit connected to one end of the at least one data line, and the second circuit being an inspection circuit connected to at least one output terminal of the at least one data line and a digital driver to drive the at least one data line and to enable at least one output terminal to be in a high impedance condition; comprising generating a high impedance condition to enable at least one output terminal to be in a high impedance condition; and receiving an output of the digital driver on the at least one data line.

* * * * *